United States Patent
Lee et al.

(10) Patent No.: US 11,533,566 B2
(45) Date of Patent: Dec. 20, 2022

(54) FLEXIBLE VIBRATION MODULE AND DISPLAY APPARATUS INCLUDING THE SAME

(71) Applicant: LG Display Co., Ltd., Seoul (KR)

(72) Inventors: YongWoo Lee, Paju-si (KR); Yong-Su Ham, Paju-si (KR); Taeheon Kim, Paju-si (KR); Sung-Eui Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/180,560

(22) Filed: Feb. 19, 2021

(65) Prior Publication Data
US 2021/0176567 A1 Jun. 10, 2021

Related U.S. Application Data

(62) Division of application No. 16/443,090, filed on Jun. 17, 2019, now Pat. No. 10,959,025.

(30) Foreign Application Priority Data

Mar. 29, 2019 (KR) .................. 10-2019-0037507

(51) Int. Cl.
*H04R 17/00* (2006.01)
*H01L 41/047* (2006.01)
(Continued)

(52) U.S. Cl.
CPC ......... *H04R 17/005* (2013.01); *H01L 41/047* (2013.01); *H01L 41/082* (2013.01);
(Continued)

(58) Field of Classification Search
CPC ............. H04R 17/005; H04R 2499/15; H04R 2201/003; H01L 41/37; H01L 41/082;
(Continued)

(56) References Cited

U.S. PATENT DOCUMENTS 4,424,465 A 1/1984 Ohigashi et al.
4,518,889 A * 5/1985 'T Hoen ............... B06B 1/0622
310/357

(Continued)

FOREIGN PATENT DOCUMENTS

JP H04-105797 U 9/1992
JP 2000-004499 A 1/2000
(Continued)

OTHER PUBLICATIONS

Office Action dated Aug. 6, 2021, issued in corresponding Japanese Patent Application No. 2019-166305.
(Continued)

*Primary Examiner* — Oyesola C Ojo
(74) *Attorney, Agent, or Firm* — Morgan, Lewis and Bockius LLP

(57) ABSTRACT

A flexible vibration module is disclosed. The flexible vibration module includes a piezoelectric composite layer, including: a plurality of piezoelectric portions each having a piezoelectric characteristic, where at least two of the plurality of piezoelectric portions have different sizes; and a flexible portion between the plurality of piezoelectric portions.

21 Claims, 12 Drawing Sheets

(51) Int. Cl.
  *H01L 41/08* (2006.01)
  *H01L 41/37* (2013.01)
  *H01L 41/083* (2006.01)
  *H01L 41/09* (2006.01)

(52) U.S. Cl.
  CPC ........ *H01L 41/083* (2013.01); *H01L 41/0986* (2013.01); *H01L 41/37* (2013.01); *H04R 2201/003* (2013.01); *H04R 2499/15* (2013.01)

(58) Field of Classification Search
  CPC .. H01L 41/083; H01L 41/047; H01L 41/0986
  See application file for complete search history.

(56) References Cited

U.S. PATENT DOCUMENTS

| | | | |
|---|---|---|---|
| 5,415,175 A * | 5/1995 | Hanafy | B06B 1/0622 310/369 |
| 5,792,058 A * | 8/1998 | Lee | B06B 1/0622 600/459 |
| 6,629,341 B2 | 10/2003 | Wilkie et al. | |
| 7,197,798 B2 | 4/2007 | Wilkie et al. | |
| 7,565,949 B2 * | 7/2009 | Tojo | G06F 1/1605 181/171 |
| 8,279,712 B2 | 10/2012 | Korbler et al. | |
| 8,712,079 B2 | 4/2014 | Kim et al. | |
| 8,873,776 B2 | 10/2014 | Kim et al. | |
| 8,934,228 B2 | 1/2015 | Franklin et al. | |
| 10,230,039 B2 * | 3/2019 | Park | G06F 3/016 |
| 2002/0042577 A1 * | 4/2002 | Hatangadi | B06B 1/0622 600/459 |
| 2003/0056351 A1 | 3/2003 | Wilkie et al. | |
| 2009/0115290 A1 * | 5/2009 | Cochran | B06B 1/064 29/25.35 |
| 2010/0201652 A1 | 8/2010 | Caliskan et al. | |
| 2011/0006286 A1 * | 1/2011 | Wang | B82Y 10/00 977/956 |
| 2011/0006638 A1 | 1/2011 | Ostrovskii et al. | |
| 2011/0217519 A1 * | 9/2011 | Sakashita | G03F 7/20 428/688 |
| 2011/0261021 A1 | 10/2011 | Modarres et al. | |
| 2012/0140969 A1 | 6/2012 | Fujise et al. | |
| 2012/0148073 A1 | 6/2012 | Kim et al. | |
| 2012/0243719 A1 * | 9/2012 | Franklin | G06F 1/1688 381/333 |
| 2013/0076207 A1 * | 3/2013 | Krohn | H01L 41/37 29/25.35 |
| 2013/0167881 A1 * | 7/2013 | Korbler | H01L 41/37 29/25.35 |
| 2014/0184021 A1 * | 7/2014 | Kim | H03H 9/15 310/322 |
| 2014/0210309 A1 | 7/2014 | Miyoshi | |
| 2015/0016640 A1 | 1/2015 | Inagaki | |
| 2015/0304780 A1 * | 10/2015 | Onishi | H04R 31/00 29/25.35 |
| 2016/0013396 A1 * | 1/2016 | Chung | H01L 41/1136 310/323.21 |
| 2017/0111745 A1 | 4/2017 | Miyoshi | |
| 2017/0111746 A1 | 4/2017 | Miyoshi | |
| 2017/0263848 A1 * | 9/2017 | Kim | H01L 41/0926 |
| 2017/0324851 A1 * | 11/2017 | Iwabuchi | B32B 3/08 |
| 2020/0287123 A1 * | 9/2020 | Jiang | H01L 41/37 |
| 2021/0273154 A1 * | 9/2021 | Yamamoto | H01L 41/187 |

FOREIGN PATENT DOCUMENTS

| | | |
|---|---|---|
| JP | 2005-502437 A | 1/2005 |
| JP | 2009-278498 A | 11/2009 |
| JP | 2012-134956 A | 7/2012 |
| JP | 5157324 B2 | 3/2013 |
| JP | 2014-014063 A | 1/2014 |
| JP | 2014-509028 A | 4/2014 |
| KR | 10-2010-0073075 A | 7/2010 |
| KR | 10-2016-0015348 A | 2/2016 |
| WO | 2014/050983 A1 | 4/2014 |
| WO | 2016/002677 A1 | 1/2016 |
| WO | 2016/002678 A1 | 1/2016 |

OTHER PUBLICATIONS

Office Action dated Mar. 1, 2022, issued in corresponding Japanese Patent Application No. 2019-166305. Note: US 2013/0167881, JP 2000-004499, JP H04-1057979, JP 5157324, and JP 2014-509028 cited therein were previously cited.

Office Action dated Nov. 25, 2020, issued in corresponding Japanese Patent Application No. 2019-166305.

* cited by examiner

FLEXIBLE VIBRATION MODULE AND DISPLAY APPARATUS INCLUDING THE SAME

This application is a continuation of U.S. patent application Ser. No. 16/443,090, filed on Jun. 17, 2019, which claims priority from and the benefit of Korean Patent Application No. 10-2019-0037507 filed on Mar. 29, 2019, both of which are hereby incorporated herein by reference in its entirety for all purposes as if fully set forth herein.

BACKGROUND

Technical Field

The present disclosure relates to a display apparatus, and more particularly, to a flexible vibration module and a display apparatus including the same.

Discussion of the Related Art

In display apparatuses, a display panel displays an image, and a separate speaker should be installed for providing sound. In some related art embodiments, a speaker is disposed in a display apparatus, and occupies a space. As a result, the design and spatial disposition of the display apparatus are limited.

A speaker applied to display apparatuses may be, for example, an actuator including a magnet and a coil. However, a thickness of the actuator is high. Therefore, it may be desirable to use piezoelectric elements that have lower thicknesses. Because a piezoelectric element may be brittle, piezoelectric elements may be easily damaged by external impact, thus the reliability of sound reproduction may be low.

SUMMARY

Accordingly, the present disclosure is directed to providing a flexible vibration module and a display apparatus including the same that substantially obviate one or more of the above-identified problems due to limitations and disadvantages of the related art. A speaker applied to a display apparatus may be a film type vibration module. The film type vibration module may be manufactured to have a large area and thus may be applied to a large-area display apparatus. However, due to a low vibration caused by a low piezoelectric characteristic, it may be difficult to apply the film type vibration module to the large-area display apparatus. Ceramic may be applied for enhancing a piezoelectric characteristic. As a result, durability may be weak and the size of the ceramic may be limited.

Piezoelectric ceramic may be applied to a display apparatus in a vibration module including a piezoelectric composite layer. As a result, the piezoelectric composite layer mainly vibrates in a horizontal direction of the display apparatus. This may make it difficult to sufficiently vibrate the display apparatus in a vertical direction. As a result, the display apparatus may be unable to output a desired sound to a forward region in front of the display apparatus. Alternatively, a film type piezoelectric material may be applied to a display apparatus, causing a sound pressure characteristic of the display apparatus to be lower than that of general speakers (e.g, exciters). In some example embodiments, a stacked film type piezoelectric—where a film type piezoelectric is configured with a multilayer to improve a sound pressure—may be applied to a display apparatus. As a result, power consumption increases.

A vibration module may enhance a piezoelectric characteristic, stiffness, and flexibility. A vibration module may be formed of a composite layer including a filler having a high dielectric constant and a low piezoelectric characteristic. As a result, the vibration module may be unable to realize a desired sound. In some example embodiments of the present disclosure, a vibration module may be formed of piezoelectric ceramic having a piezoelectric characteristic and formed of an organic material so as to enhance stiffness and flexibility.

In other example embodiments, a vibration module may be formed of piezoelectric ceramic having a piezoelectric characteristic and formed of a material such as a polymer to decrease the fragility of the piezoelectric ceramic. In these example embodiments, the vibration module may be configured so that the material such as a polymer is in a piezoelectric ceramic composite and the vibration module has flexibility.

In other example embodiments, a vibration module may have various vibration frequencies, a sound pressure characteristic may be enhanced, and a sound reproduction band may be enlarged. In these example embodiments, a display apparatus may include a vibration module having a structure for enhancing a piezoelectric characteristic, stiffness, and flexibility.

An aspect of the present disclosure is to provide a flexible vibration module with an enhanced piezoelectric characteristic, stiffness, and flexibility and a display apparatus including the same. Another aspect of the present disclosure is to provide a flexible vibration module with an enhanced sound pressure characteristic and expanded sound reproduction band, based on various vibration frequencies, and a display apparatus including the same. Another aspect of the present disclosure is to provide a display apparatus that outputs a sound, that is generated based on a vibration of a display panel, to a forward region in front of the display panel.

To achieve these and other aspects of the inventive concepts, and in accordance with the purpose of the present disclosure, as embodied and broadly described, a flexible vibration module includes: a piezoelectric composite layer, wherein the piezoelectric composite layer includes: a plurality of piezoelectric portions each having a piezoelectric characteristic, wherein at least two of the plurality of piezoelectric portions have different sizes; and a flexible portion between the plurality of piezoelectric portions.

In another aspect of the present disclosure, a flexible vibration module includes: a piezoelectric composite layer, wherein the piezoelectric composite layer includes: a plurality of piezoelectric portions each having a piezoelectric characteristic; and a flexible portion between the plurality of piezoelectric portions, wherein the piezoelectric composite layer has a plurality of vibration frequencies.

In another aspect of the present disclosure, a flexible vibration module includes: a flexible vibration module, wherein the flexible vibration module includes: a piezoelectric composite layer, wherein the piezoelectric composite layer includes: a plurality of piezoelectric portions each having a piezoelectric characteristic, wherein at least two of the plurality of piezoelectric portions have different sizes; and a flexible portion between the plurality of piezoelectric portions; and a display panel, wherein the display panel includes a display area configured to display an image and vibrate according to a vibration of the flexible vibration module.

According to the present disclosure, most regions of the display panel may vibrate by a film type large-area flexible vibration module. As a result, localization of a sound based on the vibration of the display panel may be more enhanced, thereby realizing a stereo sound effect. Moreover, according to the present disclosure, the display panel may vibrate according to various vibration frequencies to output a sound. As a result, a sound pressure characteristic of the sound may increase and a sound reproduction band may expand.

It is to be understood that both the foregoing general description and the following detailed description of the present disclosure are exemplary and explanatory, and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate example embodiments of the disclosure and together with the description serve to explain the principles of the disclosure. In the drawings.

DETAILED DESCRIPTION

Figure 1:
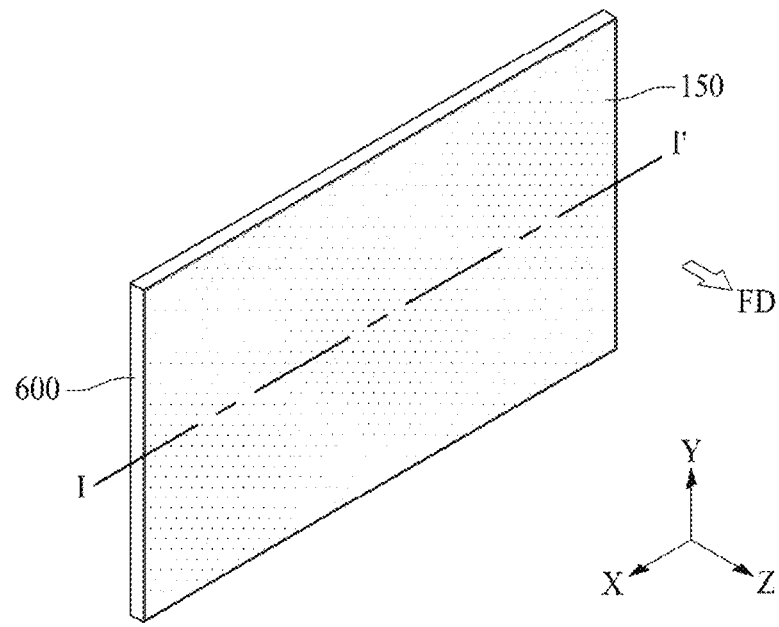
FIG. 1 is a perspective view of a display apparatus according to a first example embodiment of the present disclosure.

Reference will now be made in detail to the example embodiments of the present disclosure, examples of which may be illustrated in the accompanying drawings. Wherever possible, the same reference numbers will be used throughout the drawings to refer to the same or like parts. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure will be thorough and complete, and will fully convey the scope of the present disclosure to those skilled in the art.

A shape, a size, a ratio, an angle, and a number disclosed in the drawings for describing example embodiments of the present disclosure are merely examples, thus the present disclosure is not limited to the illustrated details. Like reference numerals refer to like elements throughout. In the following description, when the detailed description of the relevant known technology unnecessarily obscures important points of the present disclosure, the detailed description may be omitted.

Although the terms "first," "second," etc. may be used in the present disclosure to describe various elements, these elements should not be limited by these terms. These terms may be used to distinguish one element from another. For example, a first element may be termed a second element, and, similarly, a second element may be termed a first element, without departing from the scope of the present disclosure. The term "at least one" may include any and all combinations of one or more of the associated listed items. Features of various example embodiments of the present disclosure may be partially or overall coupled to or combined with each other, and may be variously inter-operated with each other. The example embodiments of the present disclosure may be carried out independently from each other, or may be carried out together in co-dependent relationship. Although the same elements may be illustrated in multiple drawings, like reference numerals may refer to like elements. Also, for convenience of description, a scale of each of elements illustrated in the accompanying drawings may differ from a real scale, and thus, is not limited to the scales illustrated in the drawings.

Figure 2:
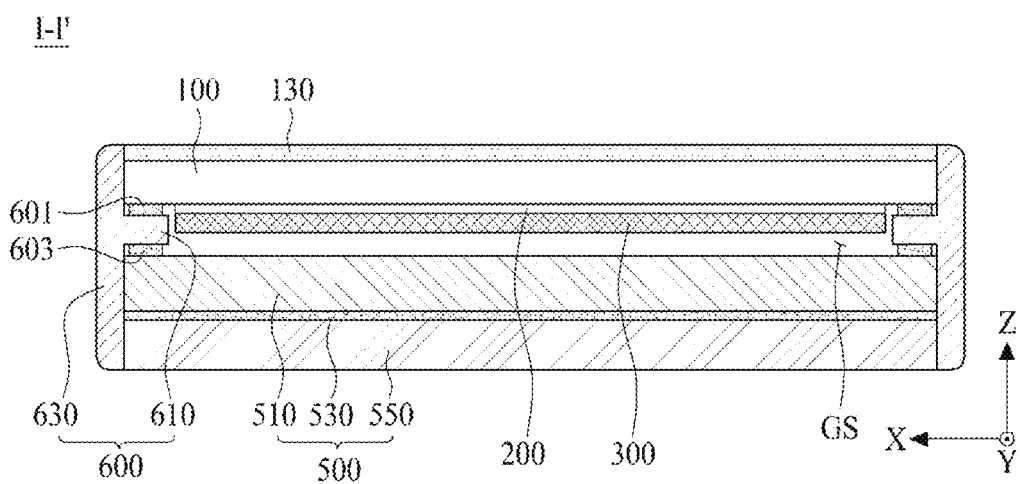
FIG. 2 is a cross-sectional view taken along line I-I' illustrated in FIG. 1.

FIG. 1 is a perspective view of a display apparatus according to a first example embodiment of the present disclosure, and FIG. 2 is a cross-sectional view taken along line I-I' illustrated in FIG. 1. As illustrated in FIGS. 1 and 2, the display apparatus according to an example embodiment of the present disclosure may include a display panel 100 and a flexible vibration module 300 disposed on a rear surface of display panel 100. Display panel 100 according to the present disclosure may be a curved display panel or one of all types of display panels such as a liquid crystal display panel, an organic light emitting display panel, a quantum dot light emitting display panel, a micro light emitting diode display panel, and an electrophoresis display panel. For example, if display panel 100 according to the present disclosure vibrates by flexible vibration module 300 to generate a sound wave (or a sound) or to generate a haptic feedback responding to a touch, display panel 100 is not limited to a specific display panel.

In some example embodiments, display panel 100 may include a thin film transistor (TFT) array substrate including a plurality of pixels defined by a plurality of gate lines and a plurality of data lines and a TFT in each of the plurality of pixels to drive each of the plurality of pixels, a light emitting device layer on the TFT array substrate, and an encapsulation substrate covering the light emitting device layer. For example, the encapsulation substrate may protect the TFT and the light emitting device layer from an external impact and may prevent water from penetrating the light emitting device layer. Display panel 100 may include a display area that displays an image according to driving the plurality of pixels and a non-display area that surrounds the display area.

Display panel 100 may include a bending portion that is bent or curved to have a curved shape or a certain curvature radius. The bending portion of display panel 100 may be in at least one of one edge (or periphery) and another edge (or periphery) of display panel 100 that are parallel to each other. These edges may include only the non-display area, or may include an edge or periphery of the display area and the non-display area. In some example embodiments, display panel 100 may include the bending portion provided by bending the non-display area and may have a structure including a one-sided bezel bending structure or a two-sided bezel bending structure. In other example embodiments, display panel 100 may include the bending portion provided by bending the non-display area and may have a structure including a one-sided active bending structure or a two-sided active bending structure.

The display apparatus according to an example embodiment of the present disclosure may further include a functional film 130 disposed on display panel 100. Functional film 130 may be disposed on a front surface of display panel 100. In some example embodiments, functional film 130 may be attached on a front surface of display panel 100 by a film adhesive member. In some example embodiments, the film adhesive member may include a pressure sensitive adhesive (PSA), an optically clear adhesive (OCA), or an optically clear resin (OCR). Functional film 130 may include at least one of an anti-reflection layer (or an anti-reflection film) for preventing reflection of external light, a barrier layer (or a barrier film) for primarily preventing penetration of water or oxygen, and a light path control layer (or a light path control film) for controlling a light path (or a viewing angle).

The display apparatus according to an example embodiment of the present disclosure may further include a touch panel (or a touch electrode layer) for sensing a user touch applied to display panel 100. For example, the touch panel may be disposed to overlap the display area and may act as a touch sensor for sensing the user touch applied to display panel 100. For example, the touch panel may be disposed between a light emitting device layer and an encapsulation substrate, or may be disposed between display panel 100 and functional film 130. The touch panel may include a plurality of touch electrodes for sensing a variation of a capacitance caused by the user touch based on a mutual capacitive type or a self-capacitive type.

Flexible vibration module 300 may be disposed on a rear surface (or a backside) of display panel 100 and may vibrate display panel 100. Flexible vibration module 300 may be a thin film type that has various vibration frequencies (or natural vibration frequencies, or natural frequencies) based on a piezoelectric characteristic and may have relatively high flexibility. For example, flexible vibration module 300 may have a thickness that is thinner than that of display panel 100. Flexible vibration module 300 may be referred to as a sound generating module, a sound generating device, a film actuator, a film type piezoelectric composite actuator, a film speaker, a film type piezoelectric speaker, or a film type piezoelectric composite speaker. Flexible vibration module 300 may use display panel 100 as a vibration plate.

Flexible vibration module 300 may be formed of piezoelectric ceramic having a piezoelectric characteristic. To improve an impact resistance of piezoelectric ceramic and to realize flexibility, flexible vibration module 300 may be formed of a material such as a polymer in piezoelectric ceramic. In some example embodiments, flexible vibration module 300 may include piezoelectric ceramic having a perovskite crystalline structure, and may vibrate (or exhibit mechanical displacement) in response to an electrical signal applied from the outside.

Flexible vibration module 300 may vibrate at various vibration frequencies according to an electrical signal. For example, flexible vibration module 300 may vibrate according to a voice signal synchronized with an image displayed by display panel 100 to vibrate display panel 100. A sound generated based on a vibration of display panel 100 may have a sound pressure characteristic that increases based on a vibration having various vibration frequencies. The vibration of flexible vibration module 300 may expand a sound reproduction band. In an example embodiment, the flexible vibration module 300 may be disposed on display panel 100 and may vibrate according to a haptic feedback signal (or a tactile feedback signal) synchronized with a user touch applied to a touch panel (or a touch sensor layer) embedded into display panel 100 to vibrate display panel 100. Accordingly, display panel 100 may vibrate based on a vibration of flexible vibration module 300 to provide a user (or a viewer) with at least one of a sound and a haptic feedback.

Moreover, flexible vibration module 300 according to an example embodiment may have a size corresponding to the display area of display panel 100. A size of flexible vibration module 300 may be 0.9 to 1.1 times a size of the display area. For example, a size of flexible vibration module 300 may be the same as or approximately equal to that of the display area of display panel 100, thus flexible vibration module 300 may cover most of display panel 100. A vibration generated by flexible vibration module 300 may vibrate a whole portion of display panel 100, thus localization of a sound may be high and satisfaction of a user may be improved. A contact area (or panel coverage) between display panel 100 and flexible vibration module 300 may increase, thus a vibration region of display panel 100 may increase. This improves a sound of a middle to low pitch sound band generated based on a vibration of display panel 100. In a large-sized display apparatus, a whole portion of display panel 100 having a large size (or a large area) may vibrate, thus localization of a sound based on a vibration of display panel 100 may be enhanced, thereby realizing a stereo sound effect.

In some example embodiments, flexible vibration module 300 may be attached to the rear surface of display panel 100 by an adhesive member 200 (or a module adhesive member). Adhesive member 200 may be disposed between the rear surface of display panel 100 and flexible vibration module 300. For example, adhesive member 200 may attach flexible vibration module 300 on the rear surface of display panel 100 and may be an adhesive or a double-sided tape including an adhesive layer having a high adhesive force or attaching force. For example, the adhesive layer of adhesive member 200 may include epoxy, acryl, silicon, or urethane. The adhesive layer of adhesive member 200 may further include an additive such as a tackifier or an adhesion enhancing agent, a wax component, or an anti-oxidation agent. The additive may prevent or reduce the adhesive member 200 from being detached (or stripped) from display panel 100 by a vibration of vibration module 300. For example, the tackifier may be rosin derivative, the wax component may be paraffin wax, and the anti-oxidation agent may be a phenol-based anti-oxidation agent such as thiolester.

According to another example embodiment, adhesive member 200 may further include a hollow portion between display panel 100 and flexible vibration module 300. The hollow portion of adhesive member 200 may provide an air gap between display panel 100 and flexible vibration module 300. Due to the air gap, a sound wave (or a sound pressure) based on a vibration of flexible vibration module 300 may not be dispersed by adhesive member 200 and may concentrate on display panel 100. Therefore, the loss of a vibration caused by adhesive member 200 may be minimized or reduced, thereby increasing a sound pressure characteristic of a sound generated based on a vibration of display panel 100.

The display apparatus according to an example embodiment of the present disclosure may further include a rear structure 500 that supports display panel 100. Rear structure 500 may be referred to as a rear cover, a cover bottom, a plate bottom, a back cover, a base frame, a metal frame, a metal chassis, a chassis base, or an m-chassis. Rear structure 500 may be a supporter that supports display panel 100 and may be an arbitrary type frame or a plate structure each disposed on a rear surface of the display apparatus.

Rear structure 500 according to an example embodiment may include a first rear cover 510 and a second rear cover 550. First rear cover 510 may be a plate member covering the whole rear surface of display panel 100. First rear cover 510 may be spaced apart from a rearmost surface of display panel 100 with a gap space GS therebetween. For example, gap space GS may be referred to as an air gap, a vibration space, or a sound box. Second rear cover 550 may be a plate member that is disposed on a rear surface of first rear cover 510 to cover the whole rear surface of first rear cover 510.

First rear cover 510 and second rear cover 550 according to an example embodiment may be coupled or connected to each other by a cover connection member 530. For example, cover connection member 530 may be an adhesive resin, a double-sided adhesive tape, or a double-sided adhesive foam pad, and may have elasticity for absorbing an impact. For example, the cover connection member 530 may be disposed in a whole region between the first rear cover 510 and the second rear cover 550. In another example embodiment, the cover connection member 530 may be in a mesh structure including an air gap between the first rear cover 510 and the second rear cover 550.

The display apparatus according to an example embodiment of the present disclosure may further include a middle frame 600. Middle frame 600 may be disposed between a rear edge or a rear periphery of display panel 100 and a front edge or a front periphery of rear structure 500. Middle frame 600 may support an edge or a periphery of each of display panel 100 and rear structure 500 and may surround a side surface of each of display panel 100 and rear structure 500. The middle frame 600 may provide a gap space GS between display panel 100 and rear structure 500. Middle frame 600 may include a middle cabinet, a middle cover, or a middle chassis.

Middle frame 600 according to an example embodiment may include a supporting part 610 and a sidewall portion 630. Supporting part 610 may be disposed between the rear edge or the rear periphery of display panel 100 and the front edge or the front periphery of rear structure 500, and thus, may provide a gap space GS between display panel 100 and rear structure 500. A front surface of supporting part 610 may be coupled or connected to the rear edge or the rear periphery of display panel 100 by a first adhesive member 601, and a rear surface of supporting part 610 may be coupled or connected to the front edge or the front periphery of rear structure 500 by a second adhesive member 603. For example, supporting part 610 may have a tetragonal single frame structure, or may have a plurality of division bar shapes.

Sidewall portion 630 may be vertically coupled or connected to an outer surface of supporting part 610 in parallel with a thickness direction Z of the display apparatus. Sidewall portion 630 may surround all of an outer surface of display panel 100 and an outer surface of rear structure 500 and may protect the outer surface of each of display panel 100 and rear structure 500. Supporting part 610 and the sidewall portion 630 according to an example embodiment may be coupled or connected to each other to configure a single body, and thus, may have a frame structure having a perpendicular single-sided structure.

The display apparatus according to an example embodiment of the present disclosure may include a panel connection member instead of middle frame 600. The panel connection member may be disposed between the rear edge or the rear periphery of display panel 100 and the front edge or the front periphery of rear structure 500 and may provide gap space GS between display panel 100 and rear structure 500. The panel connection member may be disposed between a rear edge or a rear periphery of display panel 100 and an edge or a periphery of rear structure 500 and may attach display panel 100 to rear structure 500. For example, the panel connection member may be a double-sided adhesive tape, a single-sided adhesive tape, or a double-sided adhesive foam pad.

In some example embodiments, the display apparatus may include the panel connection member instead of middle frame 600. Rear structure 500 may include a sidewall cover part that is bent from an end of second rear cover 550 and surrounds all of an outer surface (or an outer sidewall) of each of first rear cover 510, the panel connection member, and display panel 100. The sidewall cover part according to an example embodiment may have a single sidewall structure or a hemming structure. The hemming structure may be structure where ends of an arbitrary member is bent in a curved shape to overlap each other, or are spaced apart from each other in parallel.

The display apparatus according to an example embodiment of the present disclosure may output a sound generated based on a vibration of display panel 100 caused by a vibration of flexible vibration module 300 disposed on the rear surface of display panel 100. The sound may be output to a forward region FD in front of display panel 100, thereby enhancing immersion of a viewer watching an image displayed by display panel 100. Most regions of display panel 100 may vibrate by flexible vibration module 300 having a film type and a large area. As a result, localization of a sound based on the vibration of display panel 100 may be more enhanced, thereby realizing a stereo sound effect.

In some example embodiments, display panel 100 may vibrate according to driving of flexible vibration module 300 having various vibration frequencies to output a sound. As a result, a sound pressure characteristic of the sound may increase and a sound reproduction band may expand. In some example embodiments, even without configuring a separate haptic driving apparatus, display panel 100 may vibrate based on the vibration of flexible vibration module 300 disposed on the rear surface of display panel 100 to provide a user with a haptic feedback responding to a user touch applied to display panel 100.

Figure 3:
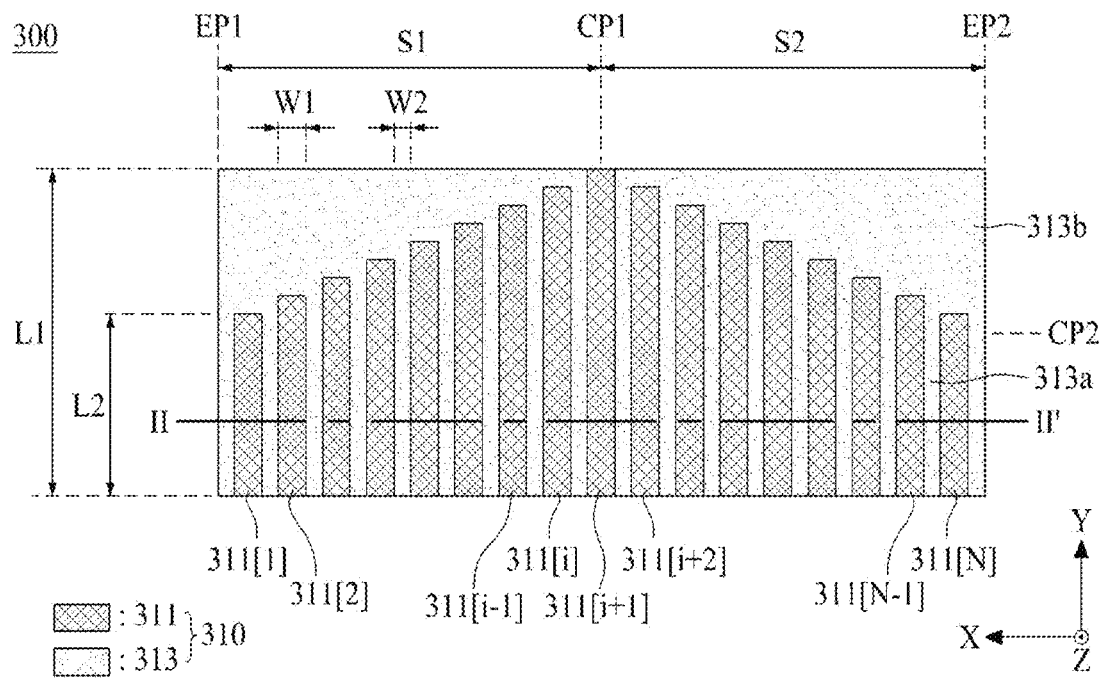
FIG. 3 illustrates a flexible vibration module according to a first example embodiment of the present disclosure.
Figure 4:
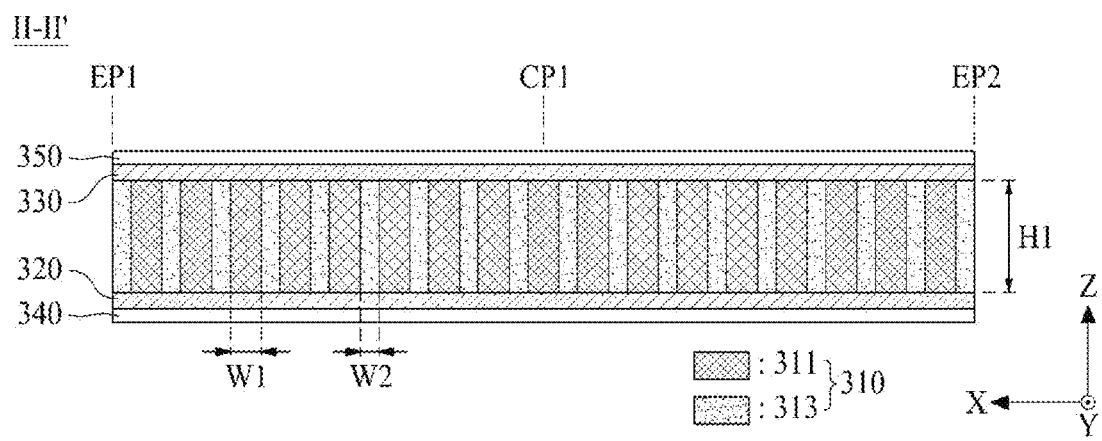
FIG. 4 is a cross-sectional view taken along line II-IF illustrated in FIG. 3.

FIG. 3 illustrates a flexible vibration module 300 according to a first example embodiment of the present disclosure, and FIG. 4 is a cross-sectional view taken along line II-IF illustrated in FIG. 3. FIGS. 3 and 4 illustrate the flexible vibration module illustrated in FIG. 2. As illustrated in FIGS. 3 and 4, flexible vibration module 300 according to the first example embodiment of the present disclosure may include a piezoelectric composite layer 310, a first electrode layer 320, and a second electrode layer 330. Piezoelectric composite layer 310 may be a thin film type that has various vibration frequencies (or natural frequencies, or natural vibration frequencies) based on a piezoelectric characteristic or a plurality of vibration frequencies and may have relatively high flexibility. Piezoelectric composite layer 310 according to an example embodiment may include a plurality of piezoelectric portions 311 and a flexible portion 313 between the plurality of piezoelectric portions 311. The plurality of piezoelectric portions 311 and flexible portion 313 may be disposed on the same plane (or the same layer). For example, piezoelectric composite layer 310 may secure a piezoelectric characteristic and flexibility.

Piezoelectric composite layer 310 may have various shapes, based on an arrangement structure of the plurality of piezoelectric portions 311 and flexible portion 313. For example, piezoelectric composite layer 310 may have a tetragonal shape, a circular shape, an elliptical shape, or a polygonal shape. Each of the plurality of piezoelectric portions 311 may include a polygonal pattern. For example, the plurality of piezoelectric portions 311 may have a line pattern having a certain first width W1, may be spaced apart from one another in a first direction X, and may be in parallel in a second direction Y.

At least one of the plurality of piezoelectric portions 311 according to an example embodiment may have a different size. A size of each of the plurality of piezoelectric portions 311 may be defined as one of a length, a width, a thickness, a width, an area, and a volume. For example, some of the plurality of piezoelectric portions 311 may have the same size within a process error range (or an allowable error range, or a tolerance) occurring in a manufacturing process, and the other piezoelectric portions 311 may have different sizes. In another example embodiment, the plurality of piezoelectric portions 311 may have different sizes. For example, at least one of the plurality of piezoelectric portions 311 may have a different length, a different width, or a different thickness.

According to another example embodiment, at least one of the plurality of piezoelectric portions 311 may have a different vibration frequency. For example, some of the plurality of piezoelectric portions 311 may have the same vibration frequency, and the other piezoelectric portions 311 may have different vibration frequencies. In another example embodiment, the plurality of piezoelectric portions 311 may have different vibration frequencies, respectively.

The plurality of piezoelectric portions 311 may have a horizontal symmetrical structure with respect to a first center portion CP1 (or a widthwise-direction center line) of piezoelectric composite layer 310 parallel to the first direction X. Each of the plurality of piezoelectric portions 311 according to an example embodiment may have a size that increases in a direction from ends EP1 and EP2 to the first center portion CP1 of piezoelectric composite layer 310 in the first direction X. Therefore, the plurality of piezoelectric portions 311 may have various vibration frequencies corresponding to various sizes (or size gradients).

Each of the plurality of piezoelectric portions 311 may vibrate in a vibration mode of a d31 displacement (or direction). For example, a vibration frequency of each of the piezoelectric portions 311 may be inversely proportional to weight (or mass), and thus, may increase or decrease based on weight or based on a length of a corresponding piezoelectric portion 311. For example, when a length of each piezoelectric portion 311 decreases, the vibration frequency of each piezoelectric portion 311 may increase due to the reduction in weight. When a length of each piezoelectric portion 311 increases, the vibration frequency of each piezoelectric portion 311 may decrease due to the increase in weight.

In another example embodiment, a resonance frequency of each piezoelectric portion 311 may be adjusted based on a length or stiffness and may increase or decrease based on a length. For example, when a length of each piezoelectric portion 311 decreases, a primary resonance frequency of each piezoelectric portion 311 may increase due to the reduction in length, and when a length of each piezoelectric portion 311 increases, the primary resonance frequency of each piezoelectric portion 311 may decrease due to the increase in length. For example, when a length L of each piezoelectric portion 311 is 50 mm, a wavelength ($\lambda$) is 100 nm, and a sound wave velocity ($\upsilon$) is 1,000 m/s, primary resonance frequency ($f_1=\upsilon/\lambda$) ($\lambda=2L$) of each piezoelectric portion 311 may be about 10 kHz, and when the length L of each piezoelectric portion 311 decreases to 25 mm, a primary resonance frequency ($f_1$) of each piezoelectric portion 311 may increase to about 20 kHz.

Because each of the plurality of piezoelectric portions 311 according to an example embodiment has a size that increases in a direction from ends EP1 and EP2 to the first center portion CP1 of piezoelectric composite layer 310, piezoelectric composite layer 310 according to an example embodiment may have various vibration frequencies. As a result, a sound pressure planarization (or flatness) characteristic and a sound pressure characteristic of a sound generated based on a vibration of display panel 100 may increase and a sound reproduction band may expand.

In some example embodiments, piezoelectric composite layer 310 may include first to $N^{th}$ (where N is an odd number equal to or more than five) piezoelectric portions 311[1] to 311[N]. The $i+1^{th}$ (where i is (N−1)/2) piezoelectric portion 311[i+1] may be in the first center portion CP1 of piezoelectric composite layer 310. The first to $i^{th}$ piezoelectric portions 311[1] to 311[i] may be disposed on a first side S1 between the one end EP1 and the first center portion CP1 of piezoelectric composite layer 310. The $i+2^{th}$ to $N^{th}$ piezoelectric portions 311[i+2] to 311[N] may be disposed on a second side S2 between the other end EP2 opposite to the one end EP1 and the first center portion CP1 of piezoelectric composite layer 310. Piezoelectric portions, other than the $i+1^{th}$ piezoelectric portion 311[i+1], of the first to $N^{th}$ piezoelectric portions 311[1] to 311[N] may have a vertical asymmetrical structure with respect to a second center portion CP2 (or a lengthwise direction center line) of piezoelectric composite layer 310 parallel to the second direction Y. As a result, one end of the piezoelectric portions, other than the $i+1^{th}$ piezoelectric portion 311[i+1], of the first to $N^{th}$ piezoelectric portions 311[1] to 311[N], may be spaced apart from one side (or an upper side) of piezoelectric composite layer 310 parallel to the first direction X.

According to an example embodiment, the first to $N^{th}$ piezoelectric portions 311 may have the same width W1 and thickness H1 (or height) within a process error range (or an allowable error range or a tolerance) occurring in a manufacturing process. The $i+1^{th}$ piezoelectric portion 311[i+1] may have a largest length among lengths of the piezoelectric portions 311, and for example, may have a first length L1 corresponding to a lengthwise length of piezoelectric composite layer 310 parallel to the second direction Y. Each of the first piezoelectric portion 311[1] and the $N^{th}$ piezoelectric portion 311[N] may be disposed closest to an end of piezoelectric composite layer 310 and may have a smallest length among lengths of the piezoelectric portions 311, and for example, may have a second length L2 that is shorter than the first length L1 of the $i+1^{th}$ piezoelectric portion 311[$i+1$].

The second to $i^{th}$ piezoelectric portions 311[2] to 311[$i$] may have different lengths within a range that is longer than the first piezoelectric portion 311[1] and shorter than the $i+1^{th}$ piezoelectric portion 311[$i+1$] and may have a longer length as being closer to the $i+1^{th}$ piezoelectric portion 311[$i+1$]. The $i+2$th to $N-1^{th}$ piezoelectric portions 311[$i+2$] to 311[N−1] may have different lengths within a range that is longer than the $N^{th}$ piezoelectric portion 311[N] and is shorter than the $i+1^{th}$ piezoelectric portion 311[$i+1$] and may have a longer length as being closer to the $i+1^{th}$ piezoelectric portion 311[$i+1$]. Therefore, the first to $i+1^{th}$ piezoelectric portions 311[1] to 311[$i+1$] may have different vibration frequencies, based on different sizes (or lengths), and the $i+2^{th}$ to $N^{th}$ piezoelectric portions 311[$i+2$] to 311[N] may have different vibration frequencies, based on different sizes (or lengths). Piezoelectric portions having a horizontal symmetrical structure with respect to the $i+1^{th}$ piezoelectric portion 311[$i+1$] of the first to $N^{th}$ piezoelectric portions 311[1] to 311[N] may have the same vibration frequencies.

The plurality of piezoelectric portions 311 according to an example embodiment may be grouped into a plurality of groups (or piezoelectric groups). The plurality of groups may include a same or different number of piezoelectric portions 311. Piezoelectric portions 311 in the same group may have the same size within a process error range (or an allowable error range or a tolerance) occurring in a manufacturing process. The plurality of piezoelectric portions 311 may have different sizes by units of groups. For example, the plurality of piezoelectric portions 311 may have the same width and thickness (or height) within the process error range (or the allowable error range or a tolerance) occurring in the manufacturing process and may have different lengths by units of groups. Accordingly, the plurality of groups may have different vibration frequencies.

According to an example embodiment, each of the plurality of groups may include two or more of the plurality of piezoelectric portions 311. Two or more piezoelectric portions 311 in each group may be disposed adjacent to each other or may be in a horizontal symmetrical structure with respect to the first center portion CP1 of piezoelectric composite layer 310. Piezoelectric portions in groups other than a group in the first center portion CP1 of piezoelectric composite layer 310 may be in a vertical asymmetrical structure with respect to the second center portion CP2 of piezoelectric composite layer 310.

For example, as in FIG. 3, when piezoelectric composite layer 310 includes first to seventeenth piezoelectric portion 311[1] to 311[N], seventeen piezoelectric portion 311[1] to 311[N] may be grouped into first to ninth groups. The first group may include one piezoelectric portion in the first center portion CP1 of piezoelectric composite layer 310, each of the second to ninth groups may include two piezoelectric portions, and two piezoelectric portions in each of the second to ninth groups may be in a horizontal symmetrical structure with respect to the first center portion CP1 of piezoelectric composite layer 310. For example, the first group may include a ninth piezoelectric portion 311[$i+1$] in the first center portion CP1 of piezoelectric composite layer 310, the second group may include an eighth piezoelectric portion 311[$i$] and a tenth piezoelectric portion 311[$i+2$] that are closest to the first group, and the ninth group may include a first piezoelectric portion 311[1] closest to the one end EP1 of piezoelectric composite layer 310 and a seventeenth piezoelectric portion 311[N] closest to the other end EP2 of piezoelectric composite layer 310. Accordingly, the first to ninth groups may have different vibration frequencies due to piezoelectric portions 311 having different sizes, respectively, and vibration frequencies of the groups may be horizontally symmetrical with respect to the first center portion CP1 of piezoelectric composite layer 310.

Each of the plurality of piezoelectric portions 311 according to an example embodiment may include an inorganic material or a piezoelectric material that each vibrates based on a piezoelectric effect (or a piezoelectric characteristic) caused by an electric field. For example, each of the plurality of piezoelectric portions 311 may be referred to as an active portion, an inorganic material portion, a piezoelectric material portion, or a vibration portion.

Each of the plurality of piezoelectric portions 311 may be formed of a ceramic-based material for generating a relatively high vibration, or may be formed of piezoelectric ceramic having a perovskite-based crystalline structure. For example, the inorganic material portion in each of the plurality of piezoelectric portions 311 may include one or more materials of lead (Pb), zirconium (Zr), titanium (Ti), zinc (Zn), nickel (Ni), manganese (Mn) and niobium (Nb). In another example embodiment, the inorganic material portion in each of the plurality of piezoelectric portions 311 may include a lead zirconate titanate (PZT)-based material including lead (Pb), zirconium (Zr), and titanium (Ti) or may include a lead zirconate nickel niobate (PZNN)-based material including lead (Pb), zinc (Zn), nickel (Ni), and niobium (Nb). The inorganic material portion may include at least one of $CaTiO_3$, $BaTiO_3$, and $SrTiO_3$ each without Pb. The plurality of piezoelectric portions 311 having such a configuration may alternately contract and expand based on an inverse piezoelectric effect based on a signal applied thereto. As a result, the plurality of piezoelectric portions 311 may vibrate based on a vibration mode (or a bending phenomenon) of the d31 displacement.

The flexible portion 313 may provide flexibility to piezoelectric composite layer 310 and may form a whole shape of piezoelectric composite layer 310. Flexible portion 313 according to an example embodiment may be disposed between the plurality of piezoelectric portions 311 and may be connected to a piezoelectric portion 311 adjacent thereto to allow piezoelectric composite layer 310 to have various shapes. For example, flexible portion 313 may surround or cover at least three or four outer surfaces (or sidewalls) of each of the plurality of piezoelectric portions 311.

The flexible portion 313 according to an example embodiment may have modulus and viscoelasticity that are lower than those of each piezoelectric portion 311. This may enhance the reliability of each piezoelectric portion 311 vulnerable to an impact due to a brittleness characteristic. For example, when flexible vibration module 300 for vibrating display panel 100 has an impact resistance and high stiffness, flexible vibration module 300 may have a maximum vibration characteristic. In order for flexible vibration module 300 to have an impact resistance and high stiffness, flexible portion 313 may include a material having a relatively high damping factor (tan δ) and relatively high stiffness. For example, flexible portion 313 may include a material having a damping factor (tan δ) of about 0.1 Gpa to about 1 Gpa and relatively high stiffness of about 0 Gpa to about 10 Gpa. A damping factor (tan δ) and a stiff characteristic may be described based on a correlation between a loss coefficient and modulus. Flexible portion 313 may include a material having a loss coefficient of about 0.01 to about 1 and modulus of about 1 Gpa to about 10 Gpa.

Flexible portion 313 may include an organic material or an organic polymer that each has a flexible characteristic in comparison with piezoelectric portions 311. For example, flexible portion 313 may include an organic material, an organic polymer, an organic piezoelectric material, or an organic non-piezoelectric material. For example, the flexible portion 313 may be referred to as an organic material portion, an adhesive portion, an elastic portion, a bending portion, or a damping portion. Flexible portion 313 according to an example embodiment may include at least one of an organic piezoelectric material and an organic non-piezoelectric material. As a result, flexible portion 313 may absorb an impact applied to the piezoelectric portions 313, thereby enhancing the total durability of flexible vibration module 300. The organic piezoelectric material included in the flexible portion 313 may be an organic material having an electroactive characteristic. For example, the organic piezoelectric material may include at least one of polyvinylidene fluoride (PVDF), (β-Polyvinylidene fluoride ((β-PVDF), polyvinylidene-trifluoroethylene (PVDF-TrFE), and polyvinylidene-trifluoroethylene-chloro fluoro ethelene (PVDF-TrFE-CFE).

An organic non-piezoelectric material in flexible portion 313 may include a curable resin composition and an adhesive including the curable resin composition. For example, the organic non-piezoelectric material may include at least one of an epoxy-based polymer, an acryl-based polymer, and a silicon-based polymer. Flexible portion 313 according to an example embodiment may include a plurality of flexible patterns 313a and a flexible dummy pattern 313b.

Each of the plurality of flexible patterns 313a may be configured to fill a gap region between the plurality of piezoelectric portions 311 of piezoelectric composite layer 310. For example, the plurality of flexible patterns 313a may each be disposed between two adjacent piezoelectric portions of the plurality of piezoelectric portions 311 that are parallel to the second direction Y and are spaced apart from one another by a certain interval or distance in the first direction X. Therefore, each may be a line pattern having a second width W2 corresponding to an interval or distance between the plurality of piezoelectric portions 311.

According to an example embodiment, the plurality of flexible patterns 313a may each have the same second width W2 within a process error range (or an allowable error range or a tolerance) occurring in a manufacturing process. The second width W2 of each of the plurality of flexible patterns 313a may be the same as or different from the first width W1 of each piezoelectric portion 311. A size of each of the plurality of flexible patterns 313a may be adjusted based on a needed condition of at least one of a vibration characteristic, flexibility, and a size of flexible vibration module 300. For example, in the display apparatus or flexible vibration module 300 having a piezoelectric characteristic rather than flexibility, the first width W1 of each piezoelectric portion 311 may be adjusted to be greater than the second width W2 of each of the plurality of flexible patterns 313a.

In another example embodiment, in the display apparatus or flexible vibration module 300 having flexibility rather than a piezoelectric characteristic, the first width W1 of each piezoelectric portion 311 may be adjusted to be less than the second width W2 of each of the plurality of flexible patterns 313a. Accordingly, a size of piezoelectric composite layer 310 may be adjusted based on a characteristic needed for the display apparatus, thus it may be easy to design piezoelectric composite layer 310.

Flexible dummy pattern 313b may be in a dummy region where the plurality of flexible patterns 313a and the plurality of piezoelectric portions 311 in piezoelectric composite layer 310 are not disposed. Flexible dummy pattern 313b may form a shape, other than a shape where the piezoelectric portions 311 and the flexible patterns 313a are disposed, of a whole shape of flexible vibration module 300.

Flexible dummy pattern 313b according to an example embodiment may be configured to fill a dummy region (or a region where a piezoelectric portion is not disposed) occurring in a corner of each of a first side S1 and a second side S2 of piezoelectric composite layer 310, based on a length gradient of each of the plurality of piezoelectric portions 311. Flexible dummy pattern 313b may be connected to one side surface of each of the plurality of flexible patterns 313a. For example, each of the plurality of flexible patterns 313a may have a finger structure that extends from flexible dummy pattern 313b to a space between the plurality of piezoelectric portions 311.

In some example embodiments, piezoelectric composite layer 310 may have a tetragonal shape, based on the plurality of piezoelectric portions 311, the plurality of flexible patterns 313a, and the flexible dummy pattern 313b each being disposed in the same plane. In other example embodiments, piezoelectric composite layer 310 may have a circular shape, an elliptical shape, a triangular shape, or a five or more-angular polygonal shape. For example, piezoelectric composite layer 310 may have a five or more-angular polygonal shape, and piezoelectric composite layer 310 may be a vibration source (or a vibrator or a vibration body) that is approximately circular in shape, thereby enhancing a vibration characteristic.

In piezoelectric composite layer 310, piezoelectric portions 311 and flexible patterns 313a of flexible portion 313 may be alternately repeated and connected to one another, thus piezoelectric composite layer 310 may have a thin film type. Therefore, piezoelectric composite layer 310 may be bent based on a shape of display panel 100 and may have a size corresponding to display panel 100 or may have a size for realizing a vibration characteristic or a sound characteristic that is each adjusted based on a vibration of display panel 100.

First electrode layer 320 may be disposed on a first surface (or a rear surface) of piezoelectric composite layer 310 and may be electrically connected to a first surface of each of the plurality of piezoelectric portions 311. First electrode layer 320 according to an example embodiment may include a transparent conductive material, a semitransparent conductive material, or an opaque conductive material. For example, examples of the transparent conductive material or the semitransparent conductive material may include indium tin oxide (ITO) or indium zinc oxide (IZO). Examples of the opaque conductive material may include aluminum (Al), copper (Cu), gold (Au), silver (Ag), molybdenum (Mo), and magnesium (Mg) or an alloy thereof.

Second electrode layer 330 may be disposed on a second surface (or a front surface), which is opposite to the first surface, of piezoelectric composite layer 310 and may be electrically connected to a second surface of each of the plurality of piezoelectric portions 311. Second electrode layer 330 according to an example embodiment may include a transparent conductive material, a semitransparent conductive material, or an opaque conductive material. For example, second electrode layer 330 may include the same material as that of first electrode layer 320.

Piezoelectric composite layer 310 may be polarized by a certain voltage applied to first electrode layer 320 and second electrode layer 330 in a certain temperature atmosphere or a temperature atmosphere that is changed from a high temperature to a room temperature. A polarization direction of each of the plurality of piezoelectric portions 311 may be adjusted based on a voltage applied to first electrode layer 320 and second electrode layer 330.

Flexible vibration module 300 according to an example embodiment of the present disclosure may further include a first protection film 340 and a second protection film 350. First protection film 340 may be on the first electrode layer 320 and may protect the first surface of piezoelectric composite layer 310 or the first electrode layer 320. For example, the first protection film 340 may be a polyimide (PI) film or a polyethyleneterephthalate (PET) film. Second protection film 350 may be on second electrode layer 330 and may protect the second surface of piezoelectric composite layer 310 or second electrode layer 330. For example, second protection film 350 may be a polyimide (PI) film or a polyethyleneterephthalate (PET) film.

In another example embodiment, in flexible vibration module 300, an arrangement structure of piezoelectric portions 311 is not limited to the arrangement structure illustrated in FIG. 3. The arrangement structure may be changed to various structures, based on a needed condition of at least one of a vibration characteristic, flexibility, and a size of flexible vibration module 300. For example, a length gradient or a vibration frequency of each of piezoelectric portions 311 may not be adjusted to progressively increase in a direction from ends EP1 and EP2 to the first center portion CP1 of piezoelectric composite layer 310. In other example embodiments, a length gradient or a vibration frequency of each of piezoelectric portions 311 may be adjusted to be randomly changed, or may be adjusted to progressively increase in a direction from end EP1 to end EP2 of piezoelectric composite layer 310.

Flexible vibration module 300 according to the first example embodiment of the present disclosure may vibrate based on bending caused by an inverse piezoelectric effect based on a signal applied to each of the plurality of piezoelectric portions 311 to vibrate display panel 100, thereby providing a user with a sound or a haptic feedback. Flexible portion 313 filled or disposed between the plurality of piezoelectric portions 311 may have flexibility. Therefore, even when piezoelectric composite layer 310 bends, piezoelectric portions 311 may not be damaged or may not be reduced in performance.

Flexible vibration module 300 according to the first example embodiment of the present disclosure may be disposed on the rear surface of display panel 100 to sufficiently vibrate display panel 100 in a vertical direction (or a forward-backward direction), thereby outputting a desired sound to a forward region in front of the display apparatus. Piezoelectric portions 311 and flexible portion 313 may each configure piezoelectric composite layer 310 to be implemented in a pattern shape. As a result, piezoelectric composite layer 310 may have a size corresponding to display panel 100, whereby panel coverage (or a contact area) of flexible vibration module 300 contacting display panel 100 may increase to enhance a sound characteristic based on a vibration of display panel 100. For example, flexible vibration module 300 may be configured to have a wide area corresponding to the same size as that of display panel 100. As a result, a sound pressure characteristic of a low-pitched sound band which is a drawback of a film type piezoelectric may be improved and the driving voltage may be reduced. Flexible vibration module 300 according to an example embodiment of the present disclosure may include the inorganic material portion and the organic material portion and may be a thin film type. Therefore, flexible vibration module 300 may be integrated into or equipped in the display apparatus without interference caused by a mechanical element and/or another element configuring the display apparatus.

Flexible vibration module 300 according to the first example embodiment of the present disclosure may have various vibration frequencies based on a size gradient of each of the plurality of piezoelectric portions 311. Therefore, flexible vibration module 300 may vibrate display panel 100 by using a vibration having various vibration frequencies with an electric field based on a signal applied to each of the plurality of piezoelectric portions 311. Accordingly, a sound pressure planarization (or flatness) characteristic and a sound pressure characteristic of a sound generated based on a vibration of display panel 100 may increase and a sound reproduction band may expand.

Figure 5:
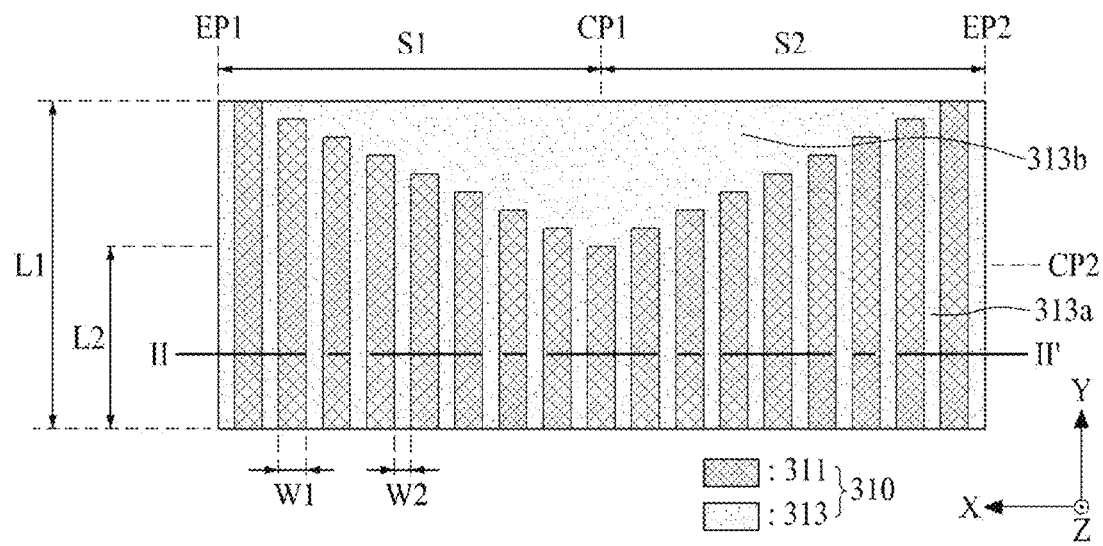
FIG. 5 illustrates a flexible vibration module according to a second example embodiment of the present disclosure.

FIG. 5 illustrates a flexible vibration module 300 according to a second example embodiment of the present disclosure and illustrates an example embodiment implemented by modifying an arrangement structure of a piezoelectric portion in piezoelectric composite layer illustrated in FIG. 3. As illustrated in FIG. 5, a piezoelectric composite layer 310 may include a plurality of piezoelectric portions 311 and a flexible portion 313 disposed between the plurality of piezoelectric portions 311.

The plurality of piezoelectric portions 311 may have a horizontal symmetrical structure with respect to a first center portion CP1 of piezoelectric composite layer 310 parallel to a first direction X. Each of the plurality of piezoelectric portions 311 may have a size that progressively decreases in a direction from ends EP1 and EP2 to the first center portion CP1 of piezoelectric composite layer 310 in the first direction X, and thus, may have various vibration frequencies corresponding to various sizes (or a length gradient). However, each of the plurality of piezoelectric portions 311 progressively decreases in a direction from ends EP1 and EP2 to the first center portion CP1 of piezoelectric composite layer 310.

Flexible portion 313 may provide flexibility to piezoelectric composite layer 310 and may form a whole shape of piezoelectric composite layer 310. Flexible portion 313 according to an example embodiment may be disposed between the plurality of piezoelectric portions 311 and may be connected to a piezoelectric portion 311 adjacent thereto to allow piezoelectric composite layer 310 to have various shapes. For example, flexible portion 313 may surround or cover at least three or four outer surfaces (or sidewalls) of each of the plurality of piezoelectric portions 311. Flexible portion 313 may include a plurality of flexible patterns 313a each configured to fill a gap region between the plurality of piezoelectric portions 311 and a flexible dummy pattern 313b in a dummy region where the plurality of piezoelectric portions 311 and the plurality of flexible patterns 313a are not disposed. Except for an arrangement position of the flexible portion illustrated in each of FIGS. 3 and 4, the flexible portion 313 is the same as the flexible portion illustrated in each of FIGS. 3 and 4.

Flexible vibration module 300 according to the second example embodiment of the present disclosure may vibrate display panel 100 at various vibration frequencies based on a size gradient (or a length gradient) of each of the plurality of piezoelectric portions 311. As a result, a sound pressure planarization (or flatness) characteristic and a sound pressure characteristic of a sound generated based on the vibration of display panel 100 may increase and a sound reproduction band may expand. For example, in flexible vibration module 300 according to the second example embodiment of the present disclosure, piezoelectric portions 311, which have a relatively low vibration frequency (or a low resonance frequency) due to a relatively large size, may be adjacent to ends EP1 and EP2 of each of piezoelectric portions 311. As a result, a vibration area of display panel 100 vibrating by piezoelectric portions 311 may expand, thus a sound of a low-pitched sound band may be improved. Accordingly, a vibration area of display panel 100 generating a sufficient low-pitched sound band may be used as broad as possible.

Figure 6:
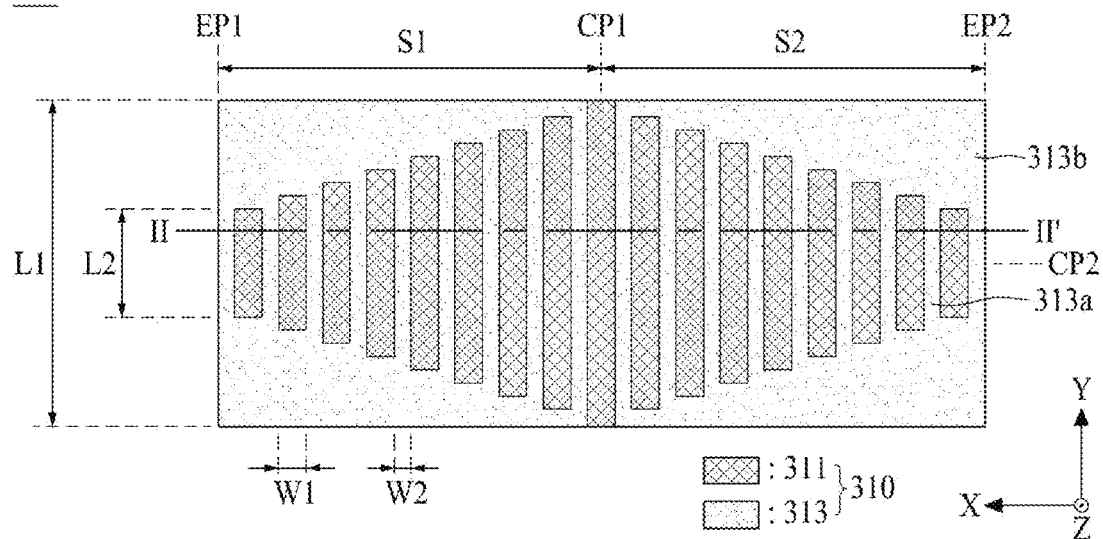
FIG. 6 illustrates a flexible vibration module according to a third example embodiment of the present disclosure.

FIG. 6 illustrates a flexible vibration module 300 according to a third example embodiment of the present disclosure and illustrates an example embodiment implemented by modifying an arrangement structure of a piezoelectric portion in the piezoelectric composite layer illustrated in FIG. 3. As illustrated in FIG. 6, in flexible vibration module 300 according to the third example embodiment of the present disclosure, a piezoelectric composite layer 310 may include a plurality of piezoelectric portions 311 and a flexible portion 313 between the plurality of piezoelectric portions 311. Each of the plurality of piezoelectric portions 311 may have a size that progressively increases in a direction from ends EP1 and EP2 to a first center portion CP1 of piezoelectric composite layer 310 in a first direction X, and thus, may have various vibration frequencies corresponding to various sizes.

A lengthwise direction center portion of each of the plurality of piezoelectric portions 311 parallel to a second direction Y may be in a second center portion CP2 of piezoelectric composite layer 310. Both ends of the piezoelectric portions other than a piezoelectric portion in the first center portion CP1 of piezoelectric composite layer 310 may be spaced apart from both sides (or an upper side and a lower side) of piezoelectric composite layer 310 parallel to the first direction X. Each of the plurality of piezoelectric portions 311 may have a size that progressively increases in a direction from ends EP1 and EP2 to the first center portion CP1 of piezoelectric composite layer 310 in the first direction X, and thus, may have various vibration frequencies corresponding to various sizes (or a length gradient). Except for the plurality of piezoelectric portions 311 being in a horizontal symmetrical structure with respect to the first center portion CP1 of piezoelectric composite layer 310 and in a vertical symmetrical structure with respect to the second center portion CP2 of piezoelectric composite layer 310, the plurality of piezoelectric portions 311 are the same as FIGS. 3 and 4.

Flexible portion 313 may provide flexibility to piezoelectric composite layer 310 and may form a whole shape of piezoelectric composite layer 310. Flexible portion 313 according to an example embodiment may be between the plurality of piezoelectric portions 311 and may be connected to a piezoelectric portion 311 adjacent thereto to allow piezoelectric composite layer 310 to have various shapes. For example, flexible portion 313 may surround or cover all of four outer surfaces (or sidewalls) of each of the plurality of piezoelectric portions 311. The flexible portion 313 may include a plurality of flexible patterns 313a each configured to fill a gap region between the plurality of piezoelectric portions 311 and a flexible dummy pattern 313b in a dummy region where the plurality of piezoelectric portions 311 and the plurality of flexible patterns 313a are not disposed. Except for an arrangement position of the flexible portion illustrated in each of FIGS. 3 and 4, the flexible portion 313 is the same as the flexible portion illustrated in each of FIGS. 3 and 4. In flexible vibration module 300 according to the present example embodiment, each of the plurality of piezoelectric portions 311 may have a size that progressively decreases in a direction from ends EP1 and EP2 to the first center portion CP1 of piezoelectric composite layer 310 in the first direction X.

In flexible vibration module 300 according to the third example embodiment, an arrangement structure of the piezoelectric portions 311 is not limited to the arrangement structure illustrated in FIG. 6. In this example embodiment, flexible vibration module 300 may be changed to various structures, based on a needed condition of at least one of a vibration characteristic, flexibility, and a size of flexible vibration module 300. For example, a length gradient or a vibration frequency of each of the piezoelectric portions 311 may not be adjusted to increase progressively in a direction from ends EP1 and EP2 to the first center portion CP1 of piezoelectric composite layer 310 and may be adjusted to be randomly changed, or may be adjusted to increase progressively in a direction from end EP1 to end EP2 of piezoelectric composite layer 310 or to be randomly changed.

Figure 7:
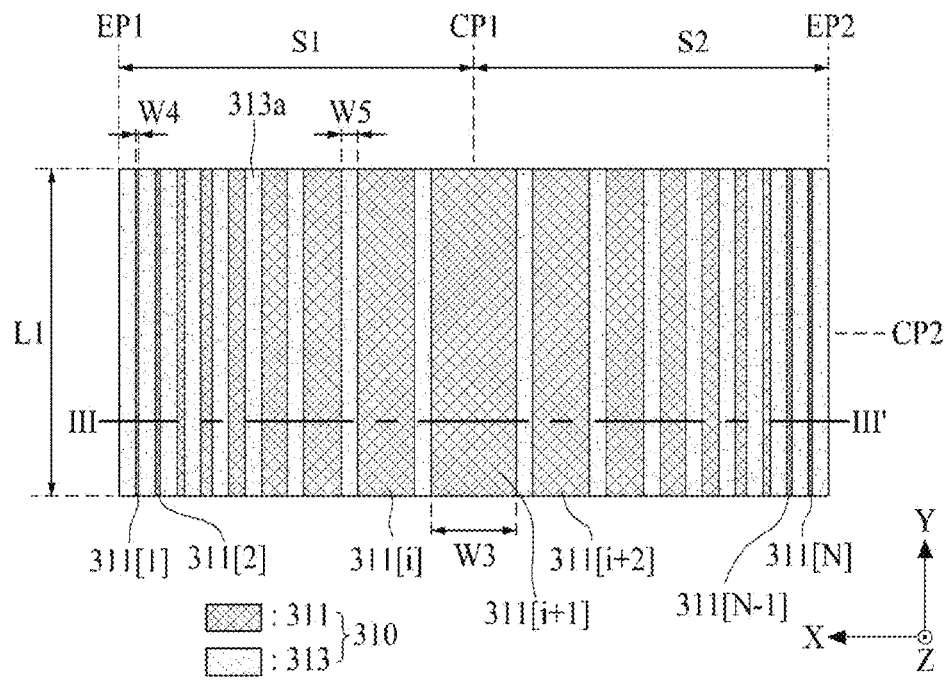
FIG. 7 illustrates a flexible vibration module according to a fourth example embodiment of the present disclosure.
Figure 8:
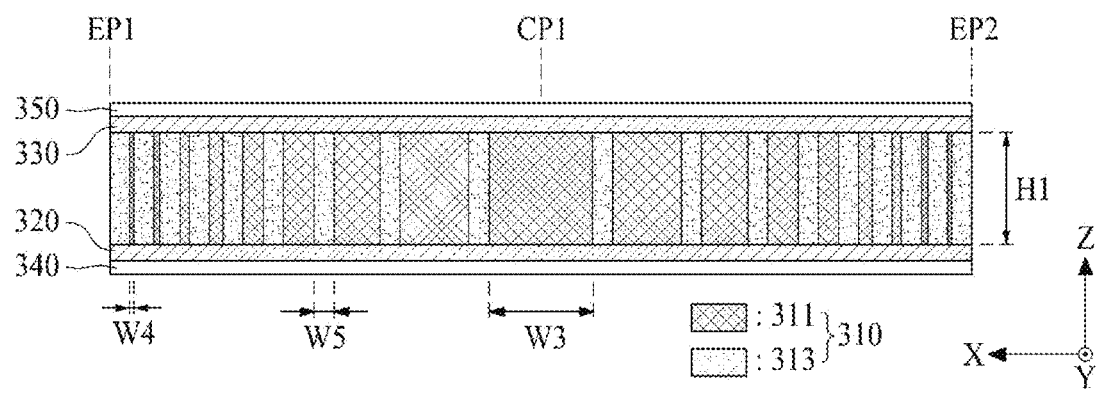
FIG. 8 is a cross-sectional view taken along line illustrated in FIG. 7.

FIG. 7 illustrates a flexible vibration module 300 according to a fourth example embodiment of the present disclosure, and FIG. 8 is a cross-sectional view taken along line illustrated in FIG. 7. FIGS. 7 and 8 illustrate an example embodiment implemented by modifying a structure of the piezoelectric composite layer illustrated in FIG. 3. As illustrated in FIGS. 7 and 8, flexible vibration module 300 according to the fourth example embodiment of the present disclosure, a piezoelectric composite layer 310 may include a plurality of piezoelectric portions 311 and a flexible portion 313 between the plurality of piezoelectric portions 311. The plurality of piezoelectric portions 311 may include a polygonal pattern. For example, the plurality of piezoelectric portions 311 may have a line pattern having a certain first length L1, may be spaced apart from one another in a first direction X, and may be in parallel in a second direction Y.

Some of the plurality of piezoelectric portions 311 according to an example embodiment may have a different size. A size of each of the plurality of piezoelectric portions 311 may be defined as one of a length, a width, a thickness, a width, an area, and a volume. For example, some of the plurality of piezoelectric portions 311 may have the same size within a process error range (or an allowable error range or a tolerance) occurring in a manufacturing process, and the other piezoelectric portions 311 may have different sizes, respectively.

The plurality of piezoelectric portions 311 may have a horizontal symmetrical structure with respect to a first center portion CP1 of piezoelectric composite layer 310 and may have a vertical symmetrical structure with respect to a second center portion CP2 of piezoelectric composite layer 310. Each of the plurality of piezoelectric portions 311 may have a size that progressively increases in a direction from ends EP1 and EP2 to the first center portion CP1 of piezoelectric composite layer 310 in the first direction X, and thus, may have various vibration frequencies corresponding to various sizes (or a width gradient).

Each of the plurality of piezoelectric portions 311 according to the present example embodiment may vibrate in a vibration mode of a d32 displacement (or direction). Each of a vibration frequency and a resonance frequency of each of the piezoelectric portions 311 may increase as a width thereof decreases in the first direction X. Piezoelectric composite layer 310 according to an example embodiment may include first to $N^{th}$ (where N is an odd number equal to or more than five) piezoelectric portions 311[1] to 311[N], and the i+1$^{th}$ (where i is (N−1)/2) piezoelectric portion 311[i+1] may be in the first center portion CP1 of piezoelectric composite layer 310. The first to $i^{th}$ piezoelectric portions 311[1] to 311[i] may be disposed on a first side S1 between one end EP1 and the first center portion CP1 of piezoelectric composite layer 310. The i+2$^{th}$ to $N^{th}$ piezoelectric portions 311[i+2] to 311[N] may be disposed on a second side S2 between the other end EP2 opposite to the one end EP1 and the first center portion CP1 of piezoelectric composite layer 310.

According to an example embodiment, the first to $N^{th}$ piezoelectric portions 311 may have the same length L1 and thickness H1 (or height) within a process error range (or an allowable error range or a tolerance) occurring in a manufacturing process. The i+1$^{th}$ piezoelectric portion 311[i+1] may have a widest width W3 among widths of the piezoelectric portions 311. Each of the first piezoelectric portion 311[1] and the $N^{th}$ piezoelectric portion 311[N] may be disposed closest to an end of piezoelectric composite layer 310 and may have a narrowest width W4 among the widths of the piezoelectric portions 311. The second to $i^{th}$ piezoelectric portions 311[2] to 311[i] may have different widths within a range that is wider than the first piezoelectric portion 311[1] and is narrower than the i+1$^{th}$ piezoelectric portion 311[i+1] and may have a wider width as being closer to the i+1$^{th}$ piezoelectric portion 311[i+1]. The i+2th to N−1$^{th}$ piezoelectric portions 311[i+2] to 311[N−1] may have different widths within a range that is wider than the $N^{th}$ piezoelectric portion 311[N] and is narrower than the i+1$^{th}$ piezoelectric portion 311[i+1] and may have a wider width as being closer to the i+1$^{th}$ piezoelectric portion 311[i+1]. Therefore, the first to i+1$^{th}$ piezoelectric portions 311[1] to 311[i+1] may have different vibration frequencies, based on respectively different widths, and the i+2$^{th}$ to $N^{th}$ piezoelectric portions 311[i+2] to 311[N] may have different vibration frequencies, based on respectively different widths. Piezoelectric portions having a horizontal symmetrical structure with respect to the i+1$^{th}$ piezoelectric portion 311[i+1] of the first to $N^{th}$ piezoelectric portions 311[1] to 311[N] may have the same vibration frequencies.

The plurality of piezoelectric portions 311 according to an example embodiment may be grouped into a plurality of groups (or piezoelectric groups). The plurality of groups may include a same or respectively different number of piezoelectric portions 311. Piezoelectric portions 311 in the same group may have the same size within a process error range (or an allowable error range or a tolerance) occurring in a manufacturing process. The plurality of piezoelectric portions 311 may have different sizes by units of groups, respectively. For example, the plurality of piezoelectric portions 311 may have the same width and thickness (or height) within the process error range (or the allowable error range or a tolerance) occurring in the manufacturing process and may have different lengths by units of groups, respectively. Accordingly, the plurality of groups may have different vibration frequencies, respectively.

According to an example embodiment, each of the plurality of groups may include two or more of the plurality of piezoelectric portions 311, and two or more piezoelectric portions 311 in each group may be disposed adjacent to each other or may be in a horizontal symmetrical structure with respect to the first center portion CP1 of piezoelectric composite layer 310. For example, as in FIG. 7, when piezoelectric composite layer 310 includes first to seventeenth piezoelectric portion 311[1] to 311[N], seventeen piezoelectric portion 311[1] to 311[N] may be grouped into first to ninth groups.

The first group may include one piezoelectric portion 311[i+1] in the first center portion CP1 of piezoelectric composite layer 310. Each of the second to ninth groups may include two piezoelectric portions. Two piezoelectric portions in each of the second to ninth groups may be in a horizontal symmetrical structure with respect to the first center portion CP1 of piezoelectric composite layer 310. For example, the first group may include a ninth piezoelectric portion 311[i+1] that has a widest width W3 and is in the first center portion CP1 of piezoelectric composite layer 310. The second group may include an eighth piezoelectric portion 311[i] and a tenth piezoelectric portion 311[i+2] that are closest to the first group. The ninth group may include a first piezoelectric portion 311[1] closest to the one end EP1 of piezoelectric composite layer 310 and a seventeenth piezoelectric portion 311[N] closest to the other end EP2 of piezoelectric composite layer 310. The first and seventeenth piezoelectric portion 311[1] and 311[N] may have a narrowest width W4 among the widths of the piezoelectric portion 311. Accordingly, the first to ninth groups may have different vibration frequencies due to piezoelectric portions 311 having different widths, respectively, and vibration frequencies of the groups may be horizontally symmetrical with respect to the first center portion CP1 of piezoelectric composite layer 310.

The flexible portion 313 may include a plurality of flexible patterns 313a each between the plurality of piezoelectric portions 311. The plurality of flexible patterns 313a may each be between two adjacent piezoelectric portions of the plurality of piezoelectric portions 311 and may improve an impact resistance of the piezoelectric portions 311 and may provide flexibility to flexible vibration module 300. The plurality of flexible patterns 313a and the plurality of piezoelectric portions 311 may be alternately disposed (or arranged) on the same plane (or the same layer). Each of the plurality of flexible patterns 313a may be configured to fill a gap between two adjacent piezoelectric portions of the plurality of piezoelectric portions 311 and may be connected to or attached on a piezoelectric portion 311 adjacent thereto. For example, the plurality of flexible patterns 313a may have a line pattern having a width W5 corresponding to a gap between two adjacent piezoelectric portions 311.

The plurality of flexible patterns 313a may each have the same size within a process error range (or an allowable error range or a tolerance) occurring in a manufacturing process, and for example, may have a width, an area, or a volume. However, the present example embodiment is not limited thereto, and the plurality of flexible patterns 313a may have different sizes or may have a size corresponding to a size of two adjacent piezoelectric portions 311. Therefore, a size of each of the plurality of flexible patterns 313a may be adjusted based on a needed condition of at least one of a vibration characteristic, flexibility, and a size of flexible vibration module 300. For example, in the display apparatus or flexible vibration module 300 needing a piezoelectric characteristic rather than flexibility, the width W5 of each flexible pattern 313a may relatively decrease. In another example embodiment, in the display apparatus or flexible vibration module 300 needing flexibility rather than a piezoelectric characteristic, the width W5 of each flexible pattern 313a may relatively increase. Accordingly, a size of piezoelectric composite layer 310 may be adjusted based on a characteristic needed for the display apparatus, and thus, it may be easy to design piezoelectric composite layer 310.

In flexible vibration module 300 according to the present example embodiment, the plurality of piezoelectric portions 311 may have a horizontal symmetrical structure with respect to a first center portion CP1 of piezoelectric composite layer 310, have a vertical symmetrical structure with respect to a second center portion CP2 of piezoelectric composite layer 310, and each have a size that decreases progressively in a direction from ends EP1 and EP2 to the first center portion CP1 of piezoelectric composite layer 310 in the first direction X. As a result, the plurality of piezoelectric portions 311 may have various vibration frequencies corresponding to various sizes (or a width gradient).

In flexible vibration module 300 according to the fourth example embodiment, an arrangement structure of the piezoelectric portions 311 is not limited to the arrangement structure illustrated in FIG. 7 and may be changed to various structures, based on a needed condition of at least one of a vibration characteristic, flexibility, and a size of flexible vibration module 300. For example, a width gradient or a vibration frequency of each of the piezoelectric portions 311 may not be adjusted to increase progressively in a direction from ends EP1 and EP2 to the first center portion CP1 of piezoelectric composite layer 310 and may be adjusted to be randomly changed, or may be adjusted to increase progressively in a direction from end EP1 to end EP2 of piezoelectric composite layer 310 or to be randomly changed.

Figure 9:
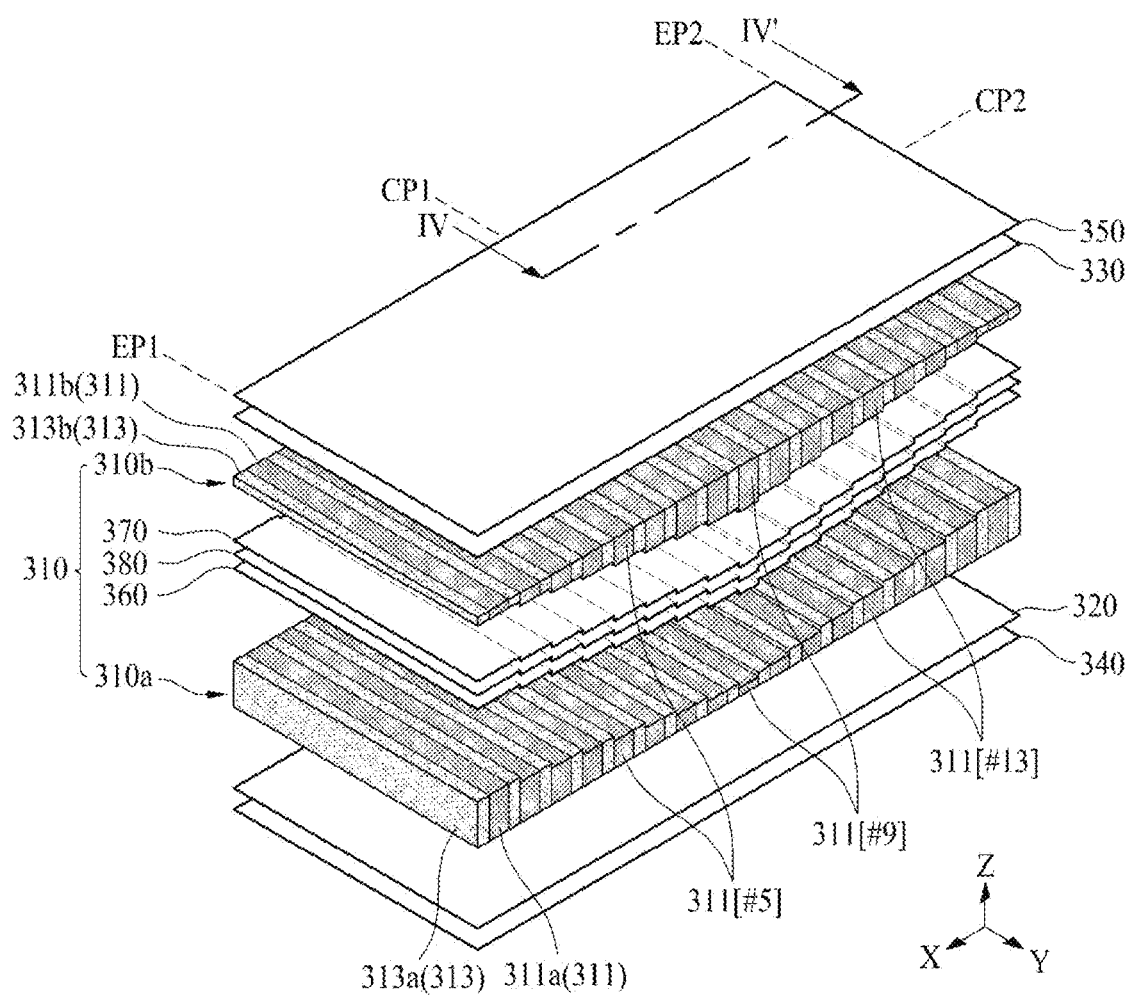
FIG. 9 illustrates a flexible vibration module according to a fifth example embodiment of the present disclosure.
Figure 10:
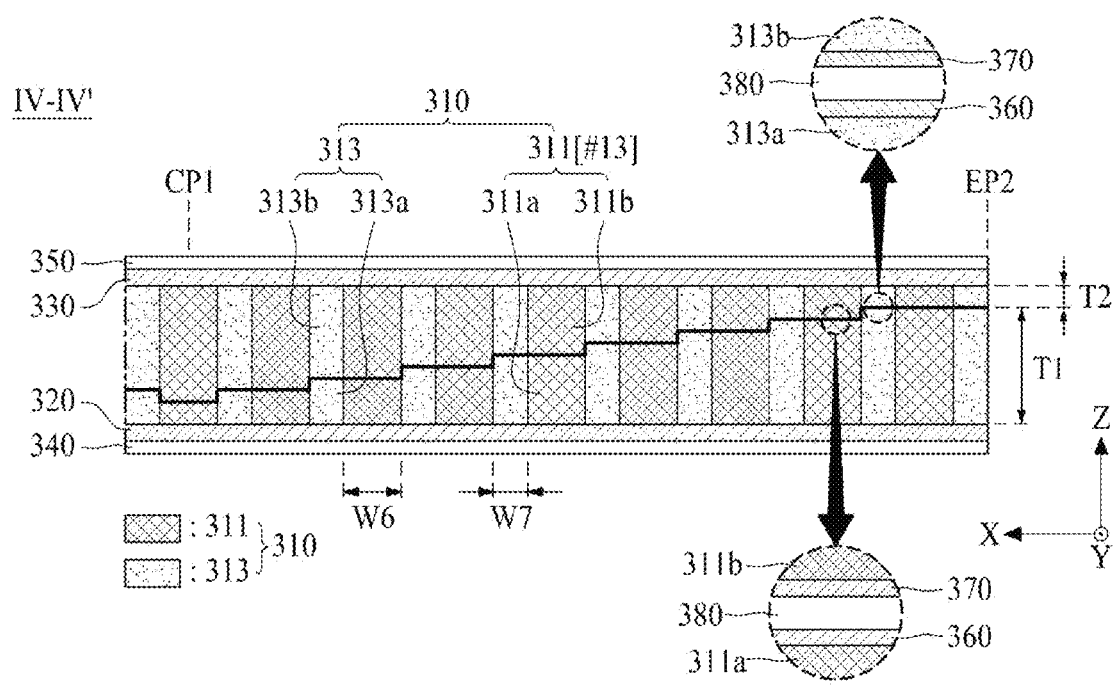
FIG. 10 is a cross-sectional view taken along line IV-IV' illustrated in FIG. 9.

FIG. 9 illustrates a flexible vibration module 300 according to a fifth example embodiment of the present disclosure, and FIG. 10 is a cross-sectional view taken along line IV-IV' illustrated in FIG. 9. FIGS. 9 and 10 illustrate an example embodiment implemented by modifying a structure of the piezoelectric composite layer illustrated in FIG. 3. As illustrated in FIGS. 9 and 10, flexible vibration module 300 according to the fifth example embodiment of the present disclosure, a piezoelectric composite layer 310 may include a plurality of piezoelectric portions 311 and a flexible portion 313 between the plurality of piezoelectric portions 311.

The plurality of piezoelectric portions 311 may include a polygonal pattern. For example, the plurality of piezoelectric portions 311 may have a line pattern having a certain length, may be spaced apart from one another in a first direction X, and may be in parallel in a second direction Y. The plurality of piezoelectric portions 311 according to an example embodiment may each have the same size within a process error range (or an allowable error range or a tolerance) occurring in a manufacturing process. For example, the plurality of piezoelectric portions 311 may each have the same width W6, thickness, and length. Sizes of the plurality of the piezoelectric portions 311 may be horizontally symmetrical with respect to a first center portion CP1 (or a widthwise direction center line) of piezoelectric composite layer 310 parallel to a first direction X.

The plurality of piezoelectric portions 311 may each include a lower piezoelectric portion 311a and an upper piezoelectric portion 311b. Thicknesses (or heights) of the lower piezoelectric portion 311a and the upper piezoelectric portion 311b of each of the plurality of piezoelectric portions 311 may all differ. The thickness (or heights) of the lower piezoelectric portion 311a and the upper piezoelectric portion 311b may have different thickness ratios (or a thickness gradient) by units of the piezoelectric portion 311. Such a thickness ratio may be horizontally symmetrical with respect to the first center portion CP1 of piezoelectric composite layer 310. For example, the lower piezoelectric portion 311a and the upper piezoelectric portion 311b each in each piezoelectric portion 311 may have an asymmetrical thickness with respect to a center thickness (or a center height).

In another example embodiment, some of the plurality of piezoelectric portions 311 may each include a lower piezoelectric portion 311a and an upper piezoelectric portion 311b each having the same thickness (or height), and the other piezoelectric portions 311 may each include a lower piezoelectric portion 311a and an upper piezoelectric portion 311b each having different thicknesses (or heights). For example, with respect to the first direction X, one piezoelectric portion 311[#5] disposed between the one end EP1 and the first center portion CP1 of piezoelectric composite layer 310 may include a lower piezoelectric portion 311a and an upper piezoelectric portion 311b each having the same thickness (or height). One piezoelectric portion 311[#13] disposed between the other end EP2 and the first center portion CP1 of piezoelectric composite layer 310 may include a lower piezoelectric portion 311a and an upper piezoelectric portion 311b may each have the same thickness (or height). Except for the piezoelectric portions 311[#5] and 311[#13] including a lower piezoelectric portion 311a and an upper piezoelectric portion 311b each having the same thickness (or height), the other piezoelectric portions may each include a lower piezoelectric portion 311a and an upper piezoelectric portion 311b each having different thicknesses (or heights).

The lower piezoelectric portion 311a of each of the plurality of piezoelectric portions 311 may have a partial thickness of a total thickness of a corresponding piezoelectric portion 311. At least one of a plurality of lower piezoelectric portions 311a may have a different thickness. For example, some of plurality of lower piezoelectric portions 311a may have the same thickness within a process error range (or an allowable error range or a tolerance) occurring in a manufacturing process, and the other lower piezoelectric portions 311a may each have different thicknesses. In another example embodiment, the plurality of lower piezoelectric portions 311a may each have different thicknesses.

The plurality of lower piezoelectric portions 311a may have a horizontal symmetrical structure with respect to the first center portion CP1 of piezoelectric composite layer 310. For example, the plurality of lower piezoelectric portions 311a may be in a stepped shape between ends EP1 and EP2 and the first center portion CP1 of piezoelectric composite layer 310. Each of the plurality of lower piezoelectric portions 311a may have a thickness that progressively decreases in a direction from ends EP1 and EP2 to the first center portion CP1 of piezoelectric composite layer 310. As a result, the plurality of lower piezoelectric portions 311a may each have various vibration frequencies or different vibration frequencies each corresponding to various sizes (or a thickness gradient).

At least two of the upper piezoelectric portions 311b of the plurality of piezoelectric portions 311 may have a different vibration frequency. For example, the upper piezoelectric portions 311b of the plurality of piezoelectric portions 311 may each have different vibration frequencies.

The upper piezoelectric portion 311b of each of the plurality of piezoelectric portions 311 may have a thickness obtained by subtracting a thickness of an overlapping lower piezoelectric portion 311a from a total thickness of a corresponding piezoelectric portion 311. Except for a piezoelectric portion in the first center portion CP1 of piezoelectric composite layer 310, the other piezoelectric portions may have an asymmetrical thickness structure with respect to a center thickness (or a center height) of the piezoelectric portion 311. For example, the plurality of upper piezoelectric portions 311b may be in a stepped shape between ends EP1 and EP2 and the first center portion CP1 of piezoelectric composite layer 310. Each of the plurality of upper piezoelectric portions 311b may have a thickness that progressively increases in a direction from ends EP1 and EP2 to the first center portion CP1 of piezoelectric composite layer 310. As a result, the plurality of lower piezoelectric portions 311a may have various vibration frequencies corresponding to various sizes (or a thickness gradient).

Except for the piezoelectric portions 311[#5] and 311 [#13] including a lower piezoelectric portion 311a and an upper piezoelectric portion 311b each having the same thickness (or height), the other piezoelectric portions may have a vertical stacked structure. The vertically stacked structure may include a lower piezoelectric portion 311a having a relatively thick thickness and an upper piezoelectric portion 311b having a relatively thin thickness. Alternatively the vertically stacked structure may include a lower piezoelectric portion 311a having a relatively thin thickness and an upper piezoelectric portion 311b having a relatively thick thickness, based on an arrangement position between ends EP1 and EP2 and the first center portion CP1 of piezoelectric composite layer 310.

Each of the plurality of lower piezoelectric portions 311a and each of the plurality of upper piezoelectric portions 311b according to the present example embodiment may vibrate in a vibration mode of a d33 displacement (or direction). Each of a vibration frequency and a resonance frequency of each of the piezoelectric portions 311 may increase as a thickness (or height) decreases in a third direction Z (or a thickness direction).

The plurality of piezoelectric portions 311 according to an example embodiment may be grouped into a plurality of groups (or piezoelectric groups). The plurality of groups may include a same or respectively different number of piezoelectric portions 311. For example, a lower piezoelectric portion 311a and an upper piezoelectric portion 311b of each of the plurality of piezoelectric portions 311 may have the same length and width within a process error range (or an allowable error range or a tolerance) occurring in a manufacturing process and may each have different sizes by units of groups. Accordingly, the plurality of groups may each have different vibration frequencies.

According to an example embodiment, each of the plurality of groups may include two or more of the plurality of piezoelectric portions 311. Two or more piezoelectric portions 311 in each group may be disposed adjacent to each other or may be in a horizontal symmetrical structure with respect to the first center portion CP1 of piezoelectric composite layer 310. For example, as in FIGS. 9 and 10, when piezoelectric composite layer 310 includes first to seventeenth piezoelectric portion 311, seventeen piezoelectric portion 311 may be grouped into first to ninth groups.

The first group may include one piezoelectric portion 311[#9] in the first center portion CP1 of piezoelectric composite layer 310. Each of the second to ninth groups may include two piezoelectric portions, and two piezoelectric portions in each of the second to ninth groups may be in a horizontal symmetrical structure with respect to the first center portion CP1 of piezoelectric composite layer 310. For example, the first group may include a ninth piezoelectric portion 311[#9] in the first center portion CP1 of piezoelectric composite layer 310. The second group may include an eighth piezoelectric portion and a tenth piezoelectric portion that are closest to the first group, and the ninth group may include a first piezoelectric portion closest to the one end EP1 of piezoelectric composite layer 310 and a seventeenth piezoelectric portion closest to the other end EP2 of piezoelectric composite layer 310. Piezoelectric portions 311[#5] to 311[#13] in some groups of the second to ninth groups may each include a lower piezoelectric portion 311a and an upper piezoelectric portion 311b each having the same thickness. Piezoelectric portions in the other groups may each include a lower piezoelectric portion 311a and an upper piezoelectric portion 311b each having different thicknesses by units of groups, based on an arrangement position. Accordingly, the first to ninth groups may have different vibration frequencies due to a piezoelectric portion 311 including a lower piezoelectric portion 311a and an upper piezoelectric portion 311b each having different sizes by units of groups, and vibration frequencies of the groups may be horizontally symmetrical with respect to the first center portion CP1 of piezoelectric composite layer 310.

Flexible portion 313 may be between two adjacent piezoelectric portions of the plurality of piezoelectric portions 311, may improve an impact resistance of the piezoelectric portions 311, and may provide flexibility to flexible vibration module 300. Flexible portion 313 and the plurality of piezoelectric portions 311 may be alternately disposed (or arranged) on the same plane (or the same layer). Flexible portion 313 may be configured to fill a gap between two adjacent piezoelectric portions of the plurality of piezoelectric portions 311 and may be connected to or attached on a piezoelectric portion 311 adjacent thereto. For example, flexible portion 313 may have a line pattern having a width W6 corresponding to a gap between two adjacent piezoelectric portions 311.

For example, a plurality of flexible portions each between two adjacent piezoelectric portions of the plurality of piezoelectric portions 311 may each have the same size within a process error range (or an allowable error range or a tolerance) occurring in a manufacturing process, and for example, may have a width, an area, or a volume. However, the present example embodiment is not limited thereto, and the plurality of flexible portions 313 may have different sizes or may have a size corresponding to a size of two adjacent piezoelectric portions 311. Therefore, a size of each of the plurality of flexible portions 313 may be adjusted based on a needed condition of at least one of a vibration characteristic, flexibility, and a size of flexible vibration module 300. For example, in the display apparatus or flexible vibration module 300 needing a piezoelectric characteristic rather than flexibility, the width W6 of each piezoelectric portion 311 may be adjusted to be greater than a width W7 of the flexible portion 313. In another example embodiment, in the display apparatus or flexible vibration module 300 needing flexibility rather than a piezoelectric characteristic, the width W6 of each piezoelectric portion 311 may be adjusted to be less than the width W7 of the flexible portion 313. Accordingly, a size of piezoelectric composite layer 310 may be adjusted based on a characteristic needed for the display apparatus, and thus, it may be easy to design piezoelectric composite layer 310.

The flexible portion 313 according to the present example embodiment may include a lower flexible portion 313a and an upper flexible portion 313b. A plurality of lower flexible portions 313a may each be disposed between the plurality of lower piezoelectric portions 311a of the plurality of piezoelectric portions 311. The plurality of lower flexible portions 313a and the plurality of lower piezoelectric portions 311a may be alternately disposed (or arranged) on the same plane (or the same layer). Each of the plurality of lower flexible portions 313a may be configured to fill a gap between two adjacent lower piezoelectric portions of the plurality of lower piezoelectric portions 311a and may be connected to or attached on a lower piezoelectric portion 311a adjacent thereto. Therefore, each of the lower flexible portions 313a may have the same thickness as that of a lower piezoelectric portion 311a adjacent thereto. Each lower flexible portion 313a and a corresponding lower piezoelectric portion 311a of each of the plurality of piezoelectric portions 311 may configure a lower piezoelectric composite layer 310a of piezoelectric composite layer 310.

A plurality of upper flexible portions 313b may each be disposed between the plurality of upper piezoelectric portions 311b of the plurality of piezoelectric portions 311. The plurality of upper flexible portions 313b and the plurality of upper piezoelectric portions 311b may be alternately disposed (or arranged) on the same plane (or the same layer). Each of the plurality of upper flexible portions 313b may be configured to fill a gap between two adjacent upper piezoelectric portions of the plurality of upper piezoelectric portions 311b and may be connected to or attached on an upper piezoelectric portion 311b adjacent thereto. Therefore, each of the upper flexible portions 313b may have the same thickness as that of an upper piezoelectric portion 311b adjacent thereto. Each upper flexible portion 313b and a corresponding upper piezoelectric portion 311b of each of the plurality of piezoelectric portions 311 may configure an upper piezoelectric composite layer 310b of piezoelectric composite layer 310.

In piezoelectric composite layer 310 according to the present example embodiment, the lower piezoelectric portion 311a and the upper piezoelectric portion 311b of each of the plurality of piezoelectric portions 311 may have a vertical stacked structure. As a result, an expansive force (or a tension) and a contractile force (or a compressive force) each based on a bimorph structure may increase more, thereby enhancing a sound pressure characteristic.

Piezoelectric composite layer 310 according to the present example embodiment may further include a first counter electrode layer 360, a second counter electrode layer 370, and an insulation layer 380. The first counter electrode layer 360 may be electrically connected to the lower piezoelectric portion 311a of each of the plurality of piezoelectric portions 311. For example, the first counter electrode layer 360 may be on the lower piezoelectric composite layer 310a of piezoelectric composite layer 310 and may be electrically connected to the lower piezoelectric portion 311a of each of the plurality of piezoelectric portions 311. The first counter electrode layer 360 may be formed of the same material as that of the first electrode layer 320. The lower piezoelectric portion 311a of each of the plurality of piezoelectric portions 311 may vibrate according to an electrical signal applied to the first electrode layer 320 and the first counter electrode layer 360.

The second counter electrode layer 370 may be electrically connected to the upper piezoelectric portion 311b of each of the plurality of piezoelectric portions 311. For example, the second counter electrode layer 370 may be on the upper piezoelectric composite layer 310b of piezoelectric composite layer 310 and may be electrically connected to the upper piezoelectric portion 311b of each of the plurality of piezoelectric portions 311. The second counter electrode layer 370 may be formed of the same material as that of the second electrode layer 330. The upper piezoelectric portion 311b of each of the plurality of piezoelectric portions 311 may vibrate according to an electrical signal applied to the second electrode layer 330 and the second counter electrode layer 370.

The insulation layer 380 may be between the first counter electrode layer 360 and the second counter electrode layer 370 and may electrically insulate the first counter electrode layer 360 from the second counter electrode layer 370. The insulation layer 380 may include an electrical insulating material that has adhesiveness and is compressible and restorable. For example, the insulation layer 380 may include at least one of an epoxy-based polymer, an acryl-based polymer, and a silicon-based polymer.

Figure 11:
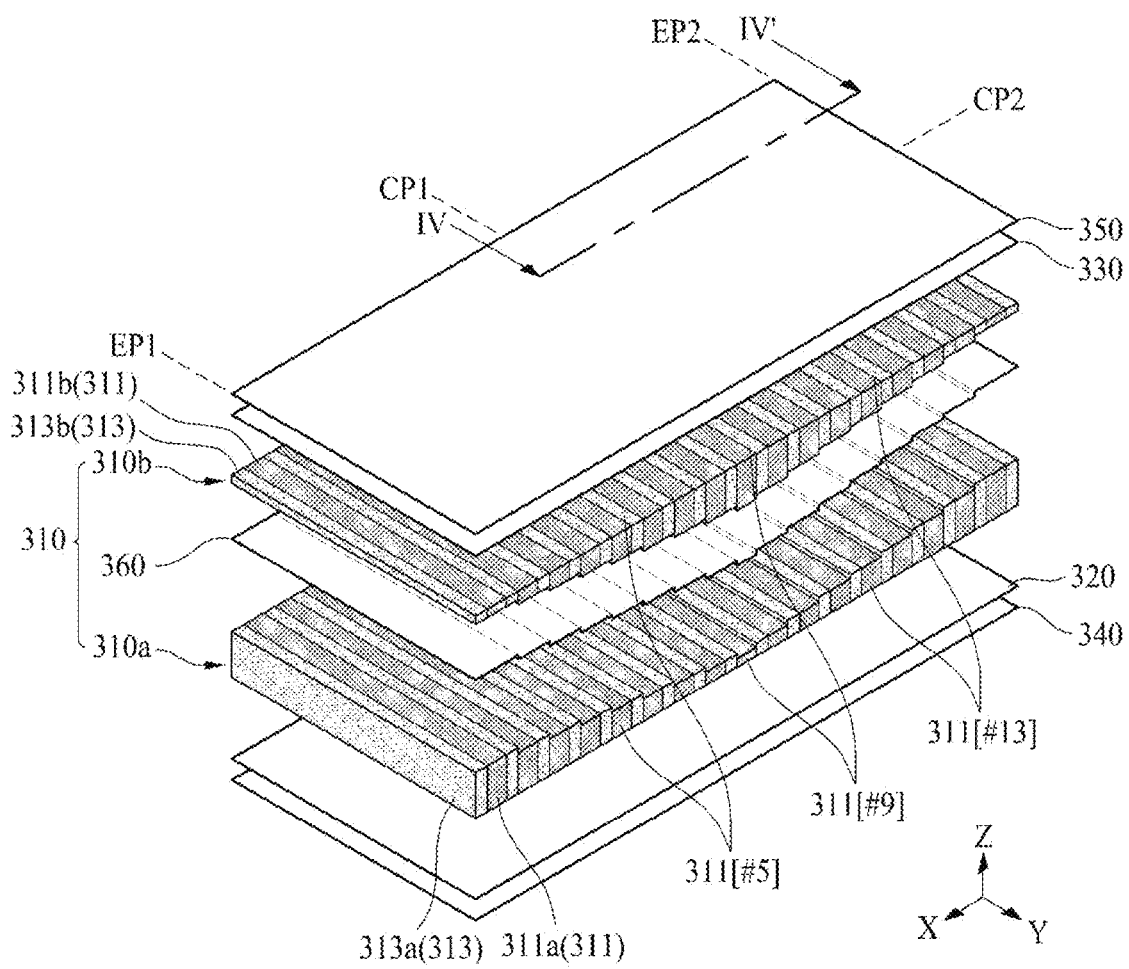
FIG. 11 illustrates a modified example embodiment of the flexible vibration module illustrated in FIG. 9.

In another example embodiment, in flexible vibration module 300, the insulation layer 380 and the second counter electrode layer 370 may be omitted. For example, as illustrated in FIG. 11, the first counter electrode layer 360 may be electrically connected to a second surface (or a front surface) of each of the lower piezoelectric portions 311a in the lower piezoelectric composite layer 310a and may be electrically connected to a first surface (or a rear surface) of each of the upper piezoelectric portions 311b in the upper piezoelectric composite layer 310b. Therefore, the first opposite electrode layer 360 may be used as a common electrode (or a shared electrode) of the lower piezoelectric composite layer 310a and the upper piezoelectric composite layer 310b, and in each of the plurality of piezoelectric portions 311, a polarization direction of each of the lower piezoelectric portions 311a may be a direction opposite to a polarization direction of each of the upper piezoelectric portions 311b.

In flexible vibration module 300 according to the fifth example embodiment, an arrangement structure of the piezoelectric portions 311 is not limited to the arrangement structure illustrated in FIG. 9 and may be changed to various structures, based on a needed condition of at least one of a vibration characteristic, flexibility, and a size of flexible vibration module 300. For example, a thickness gradient or a vibration frequency of each of the lower piezoelectric portion 311a in each of the piezoelectric portions 311 may not be adjusted to progressively decrease in a direction from ends EP1 and EP2 to the first center portion CP1 of piezoelectric composite layer 310 and may be adjusted to be randomly changed, or may be adjusted to progressively decrease in a direction from the one end EP1 to the other end EP2 of piezoelectric composite layer 310 or to be randomly changed.

In flexible vibration module 300 according to the fifth example embodiment of the present disclosure, the plurality of piezoelectric portions 311 may have various vibration frequencies, based on a thickness gradient of each of the lower piezoelectric portion 311a and the upper piezoelectric portion 311b each having a vertical stacked structure. As a result, the plurality of piezoelectric portions 311 may vibrate display panel 100 by using a vibration having various vibration frequencies with an electric field based on a signal applied to each of the plurality of piezoelectric portions 311. Accordingly, a sound pressure planarization (or flatness) characteristic and a sound pressure characteristic of a sound generated based on a vibration of display panel 100 may increase and a sound reproduction band may expand. Piezoelectric composite layer 310 may have the bimorph structure, and thus, flexible vibration module 300 according to the fifth example embodiment of the present disclosure may more increase an expansive force (or a tension) and a contractile force (or a compressive force) to sufficiently vibrate display panel 100 in a vertical direction (or a forward-backward direction). Accordingly, a sound pressure planarization (or flatness) characteristic and a sound pressure characteristic of a sound generated based on a vibration of display panel 100 may increase and a sound reproduction band may expand.

Flexible vibration module 300 according to the first to fifth example embodiments of the present disclosure may have a thin film type having relatively high flexibility, and thus, may be applied to a display apparatus that uses a display panel as a vibration plate. For example, flexible vibration module 300 according to example embodiments of the present disclosure may be applied to a flexible display, and for example, may be applied to a curved display bent at a certain curvature radius. However, flexible vibration module 300 is not limited thereto and may be applied to a rollable display wound in a spiral form, a bendable display, a wearable display wound around a wrist, or a commercial display having a plurality of curved portions. For example, the flexile vibration module 300 may be bent based on a certain curvature radius or to be bent based on winding in a spiral shape or unwinding and may be in a display panel to correspond to or overlap a whole display area of the display panel or may be in the display panel to maintain a predetermined distance to the display panel.

Figure 12:
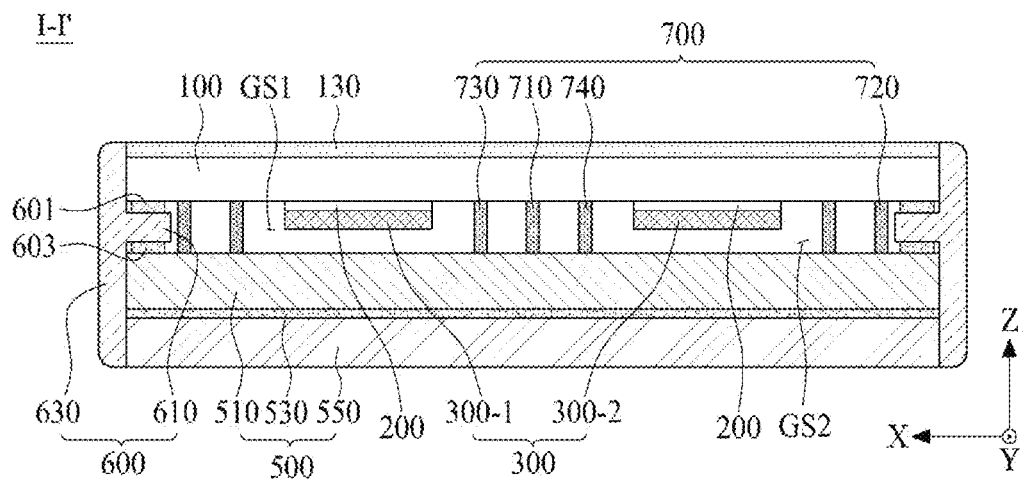
FIG. 12 is another cross-sectional view taken along line I-I' illustrated in FIG. 1.
Figure 13:
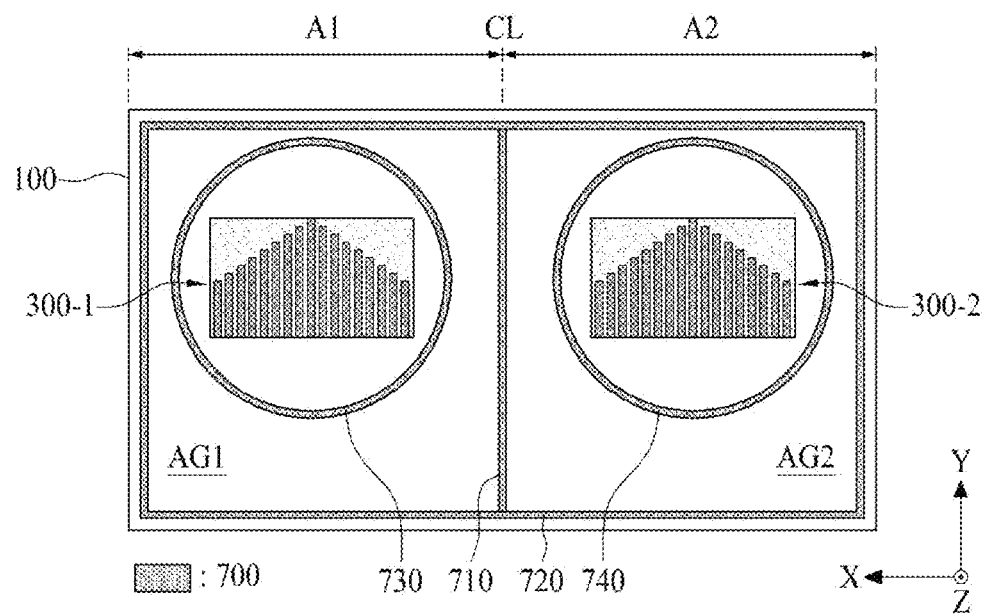
FIG. 13 illustrates the flexible vibration module and partition illustrated in FIG. 12.

FIG. 12 is another cross-sectional view taken along line I-I' in FIG. 1, and FIG. 13 illustrates a flexible vibration module and a partition each illustrated in FIG. 12. FIGS. 12 and 13 illustrate an example embodiment implemented by modifying flexible vibration module in the display apparatus illustrated in FIGS. 1 and 2. As illustrated in FIGS. 12 and 13, in a display apparatus according to another example embodiment of the present disclosure, a flexible vibration module 300 may include a first flexible vibration module 300-1 and a second flexible vibration module 300-1 each on a rear surface of a display panel 100.

The rear surface (or a back surface) of display panel 100 may include first and second regions A1 and A2. For example, the rear surface (or the back surface) of display panel 100 may be divided into the first and second regions A1 and A2. For example, in the rear surface of display panel 100, the first region A1 may be a left region, and the second region A2 may be a right region. The first and second regions A1 and A2 may be symmetrical laterally with respect to a center line CL of display panel 100 in a first direction X.

The first flexible vibration module 300-1 may be in the first region A1 of display panel 100. The first flexible vibration module 300-1 may vibrate the first region A1 of display panel 100 to generate a first panel vibration sound PVS1 or a first haptic feedback in the first region A1 of display panel 100. For example, the first panel vibration sound PVS1 may be a left sound. The first flexible vibration module 300-1 may be configured as one of flexible vibration modules 300 according to the first to fifth example embodiments of the present disclosure illustrated in FIGS. 3 to 11.

The first flexible vibration module 300-1 may be close to a center portion or an edge or a periphery of display panel 100 in the first region A1 of display panel 100 with respect to the first direction X. A size of the first flexible vibration module 300-1 may have a size equal to or greater than half of the first region A1, but is not limited thereto, and may be adjusted based on a sound characteristic needed for the display apparatus. For example, in the first region A1 of display panel 100, as a size of the first flexible vibration module 300-1 increases, a vibration region (or a vibration area) of the first region A1 may increase, thereby enhancing a low-pitched sound band characteristic of a left sound. On the other hand, in the first region A1 of display panel 100, as a size of the first flexible vibration module 300-1 decreases, a vibration region (or a vibration area) of the first region A1 may decrease, thereby enhancing a high-pitched sound band characteristic of the left sound. Accordingly, a size of the first flexible vibration module 300-1 may be adjusted based on a desired characteristic of a sound band according to a vibration of display panel 100.

The second flexible vibration module 300-2 may be in the second region A2 of display panel 100. The second flexible vibration module 300-2 may vibrate the second region A2 of display panel 100 to generate a second panel vibration sound or a second haptic feedback in the second region A2 of display panel 100. For example, the second panel vibration sound may be a right sound. The second flexible vibration module 300-2 may be the same as the first flexible vibration module 300-1 and may be symmetrical with the first flexible vibration module 300-1 with respect to the center line CL of display panel 100. The second flexible vibration module 300-2 according to an example embodiment may be close to a center portion or an edge or a periphery of display panel 100 in the second region A2 of display panel 100 with respect to the first direction X and may be symmetrical with the first flexible vibration module 300-1 with respect to the center line CL of display panel 100.

The display apparatus according to another example embodiment of the present disclosure may output, through the first and second flexible vibration modules 300-1 and 300-2, a left sound and a right sound to a forward region FD in front of display panel 100 to provide a stereo sound to a user. The display apparatus according to another example embodiment of the present disclosure may further include a partition 700 for separating a vibration region based on the first flexible vibration module 300-1 from a vibration region based on the second flexible vibration module 300-2. The partition 700 according to an example embodiment may include a first partition member 710 between the first flexible vibration module 300-1 and the second flexible vibration module 300-2.

The first partition member 710 may be on a rear center line CL of display panel 100 and may separate a first panel vibration (or a panel vibration sound) generated by the first flexible vibration module 300-1 from a second panel vibration (or a panel vibration sound) generated by the second flexible vibration module 300-2. The first partition member 710 according to an example embodiment may be between a rear center of display panel 100 and a rear structure 500 and may spatially separate a gap space GS between display panel 100 and the rear structure 500. For example, the first partition member 710 may prevent a vibration generated in the first region A1 of display panel 100 by the first flexible vibration module 300-1 from being transferred to the second region A2 of display panel 100, or may prevent a vibration generated in the second region A2 of display panel 100 by the second flexible vibration module 300-2 from being transferred to the first region A1 of display panel 100. Therefore, the first partition member 710 may attenuate or absorb a vibration of display panel 100 at a center of display panel 100, and thus, may block or prevent the transfer of a sound of the first region A1 to the second region A2 or may block or prevent the transfer of a sound of the second region A2 to the first region A1. The first partition member 710 may be referred to as a center partition, a sound separation member, a center enclosure, a center baffle, or a partition.

For example, the first partition member 710 may be formed of one of polyurethane, and/or polyolefin. In another example embodiment, the first partition member 710 may be formed of a double-sided adhesive tape or a single-sided adhesive tape, and for example, may be formed of a material having an elastic force that enables compression to be made to a certain degree. Therefore, the first partition member 710 may separate a left sound and a right sound to more enhance a sound output characteristic of the display apparatus, and a display apparatus including the first partition member 710 may separate the left and right sounds by using the first partition member 710 to output a two-channel stereo sound to the forward region in front of display panel 100.

The partition 700 according to an example embodiment may further include a second partition member 720 surrounding a region between display panel 100 and the rear structure 500. The second partition member 720 may be disposed along a space between a rear edge or a rear periphery of display panel 100 and a front edge or a front periphery of the rear structure 500 to surround all of the first and second flexible vibration modules 300-1 and 300-2. The second partition member 720 may be referred to as an edge partition, a sound blocking member, an edge enclosure, or a baffle.

The second partition member 720 may provide first and second air gaps AG1 and AG2 between display panel 100 and the rear structure 500 along with the first partition member 710. For example, each of the first and second air gaps AG1 and AG2 may be referred to as a vibration space, a sound pressure space, a sound box, a sound part, a resonance box, or a resonance part. The first air gap AG1 may be in the first region A1 of display panel 100 surrounded by the first partition member 710 and the second partition member 720 in the first region A1 of display panel 100. The second air gap AG2 may be in the second region A2 of display panel 100 surrounded by the first partition member 710 and the second partition member 720 in the second region A2 of display panel 100.

The first flexible vibration module 300-1 may be surrounded by the first partition member 710 and a portion, providing the first air gap AG1, of the second partition member 720, and the second flexible vibration module 300-2 may be surrounded by the first partition member 710 and the other portion, providing the second air gap AG2, of the second partition member 720. In another example embodiment, the second partition member 720 may be omitted.

The second partition member 720 may be between display panel 100 and the rear structure 500 and may individually (or independently) surround each of the first and second flexible vibration modules 300-1 and 300-2 along with the first partition member 710 to secure a vibration space of each of the first and second flexible vibration modules 300-1 and 300-2. This may enhance a sound pressure characteristic of left and right sounds and may prevent a sound or a sound pressure from being leaked to the outside through the side surface between display panel 100 and the rear structure 500, thereby enhancing a sound output characteristic of the display apparatus.

The partition 700 according to an example embodiment may further include a third partition member 730 surrounding the first flexible vibration module 300-1 and a fourth partition member 740 surrounding the second flexible vibration module 300-2. The third partition member 730 may be between display panel 100 and the rear structure 500 to overlap the first air gap AG1 or correspond to the first air gap AG1 and may individually (or independently) surround the first flexible vibration module 300-1. The third partition member 730 according to an example embodiment may have a circular shape surrounding the first flexible vibration module 300-1, but is not limited thereto, and may have a shape that is the same as or different from a whole shape of the first flexible vibration module 300-1. For example, when the first flexible vibration module 300-1 has a rectangular shape, the third partition member 730 may have a rectangular shape having a size that is relatively greater than that of the first flexible vibration module 300-1.

The third partition member 730 may limit (or define) a vibration region (or a vibration area) of display panel 100 based on the first flexible vibration module 300-1. For example, in the first region A1 of display panel 100, as a size of the third partition member 730 increases, a vibration region of the first region A1 may increase, and thus, a low-pitched sound band characteristic of a left sound may be enhanced. On the other hand, in the first region A1 of display panel 100, as a size of the third partition member 730 decreases, the vibration region of the first region A1 may decrease, and thus, a high-pitched sound band characteristic of the left sound may be enhanced. Accordingly, a size of the third partition member 730 may be adjusted based on a desired characteristic of a sound band, based on a vibration of display panel 100.

The fourth partition member 740 may be between display panel 100 and the rear structure 500 to overlap the second air gap AG2 or correspond to the second air gap AG2 and may individually (or independently) surround the second flexible vibration module 300-2. In order for a left sound to be symmetrical with a right sound, the fourth partition member 740 may have the same shape as that of the third partition member 730 and a symmetrical structure with the third partition member 730 with respect to the rear center line CL of display panel 100.

The fourth partition member 740 may limit (or define) a vibration region (or a vibration area) of display panel 100 based on the second flexible vibration module 300-2. For example, in the second region A2 of display panel 100, as a size of the fourth partition member 740 increases, a vibration region of the second region A2 may increase, and thus, the low-pitched sound band characteristic of the right sound may be enhanced. On the other hand, in the second region A2 of display panel 100, as a size of the fourth partition member 740 decreases, the vibration region of the second region A2 may decrease, and thus, the high-pitched sound band characteristic of the right sound may be enhanced. Accordingly, a size of the fourth partition member 740 may be adjusted based on a desired characteristic of a sound band, based on a vibration of display panel 100.

The third and fourth partition members 730 and 740 may limit a vibration region (or a vibration area) of each of the first and second flexible vibration modules 300-1 and 300-2. This may enhance lateral symmetricity of a left sound and a right sound each generated based on a vibration of display panel 100 and may optimize a sound pressure characteristic and a sound reproduction band of each of the left and right sounds.

In some example embodiments, one or more of partition members 710, 720, 730, and 740 may be formed of a double-sided adhesive tape or a single-sided adhesive tape, and for example, may be formed of a material having an elastic force that enables compression to be made to a certain degree.

Figure 14:
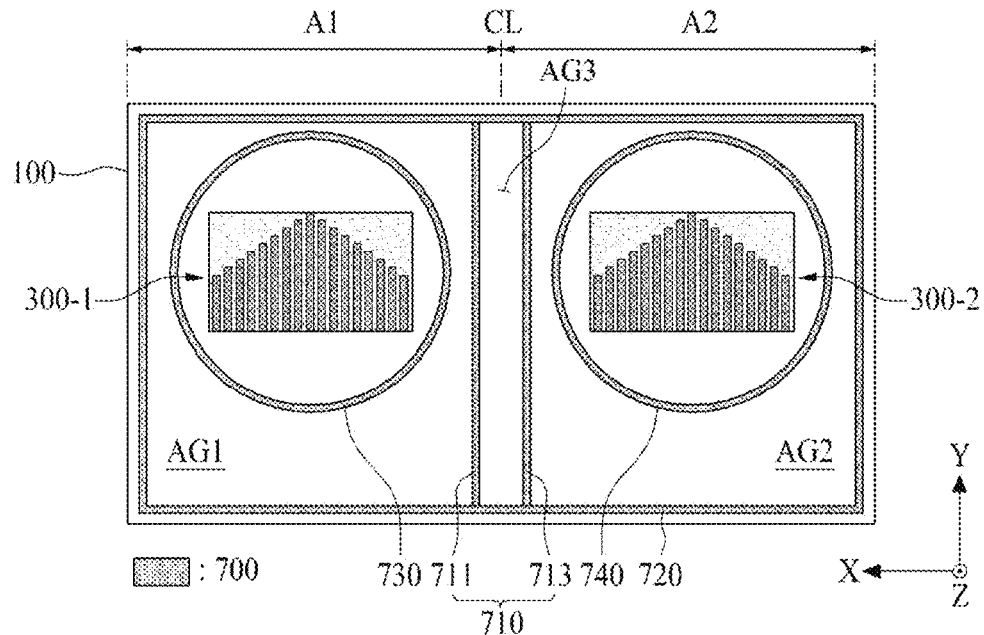
FIG. 14 illustrates the flexible vibration module and partition illustrated in FIG. 12.

FIG. 14 illustrates a flexible vibration module and a partition each illustrated in FIG. 12 and illustrates an example embodiment implemented by modifying the first partition member illustrated in FIG. 13. As illustrated in FIG. 14, in a display apparatus according to another example embodiment of the present disclosure, a first partition member 710 may include first and second sub-partition members 711 and 713 spaced apart from each other on a rear center line CL of a display panel 100. The first partition member 710 including the first and second sub-partition members 711 and 713 may be referred to as at least one first partition member.

The first and second sub-partition members 711 and 713 may be between a rear center of display panel 100 and the rear structure 500. For example, the first and second sub-partition members 711 and 713 may be in parallel between the rear center of display panel 100 and the rear structure 500. The first and second sub-partition members 711 and 713 may provide or form first to third air gaps AG1 to AG3 between display panel 100 and the rear structure 500 along with the second partition member 720.

The first air gap AG1 may be in a first region A1 of display panel 100 surrounded by the first sub-partition member 711 and the second partition member 720 in the first region A1 of display panel 100. The second air gap AG2 may be in a second region A2 of display panel 100 surrounded by the second sub-partition member 713 and the second partition member 720 in the second region A2 of display panel 100.

The third air gap AG3 may be in a center region of display panel 100 surrounded by the first and second sub-partition members 711 and 713 and the second partition member 720. For example, the third air gap AG3 may be provided between the second air gap AG2 and the first air gap AG1 including a rear center line CL of display panel 100. The third air gap AG3 may be referred to as a sound separation space, a sound blocking space, or a sound interference prevention space. The third air gap AG3 may spatially separate the first air gap AG1 from the second air gap AG2, and thus, may prevent a resonance phenomenon or an interference phenomenon in a certain frequency band, which occurs in each of the first air gap AG1 and the second air gap AG2. In another example embodiment, the second partition member 720 may be omitted.

The first flexible vibration module 300-1 may be surrounded by the first sub-partition member 711 and a portion, providing the first air gap AG1, of the second partition member 720. The second flexible vibration module 300-2 may be surrounded by the second sub-partition member 713 and the other portion, providing the second air gap AG2, of the second partition member 720. The first partition member 710 including the first and second sub-partition members 711 and 713 together with the second partition member 720 may provide the first air gaps AG1, the second air gaps AG2, and the third air gap AG3 between the first and second air gaps AG1 and AG2 that individually surround each of the first and second flexible vibration modules 300-1 and 300-2. This may secure a vibration space of each of the first and second flexible vibration modules 300-1 and 300-2 to increase a sound pressure characteristic of left and right sounds and to prevent a resonance phenomenon or an interference phenomenon of the left and right sounds, thereby enhancing a sound pressure characteristic of the left and right sounds. Accordingly, a sound output characteristic of the display apparatus may be more enhanced.

Figure 15A:
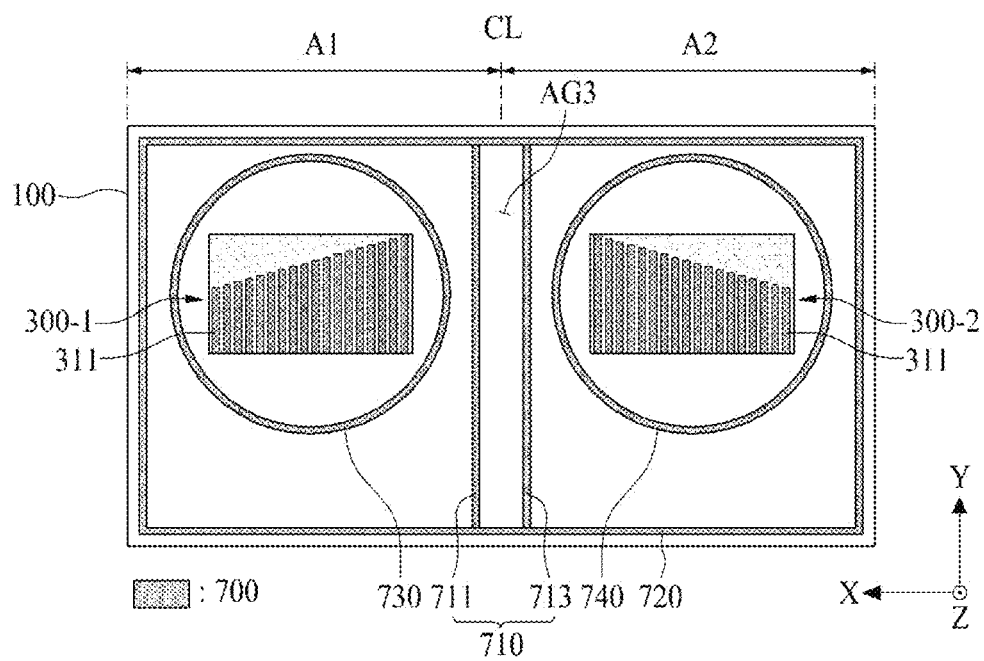
FIGS. 15A to 15C illustrate modified example embodiments of the first and second flexible vibration modules illustrated in FIG. 14.
Figure 15B:
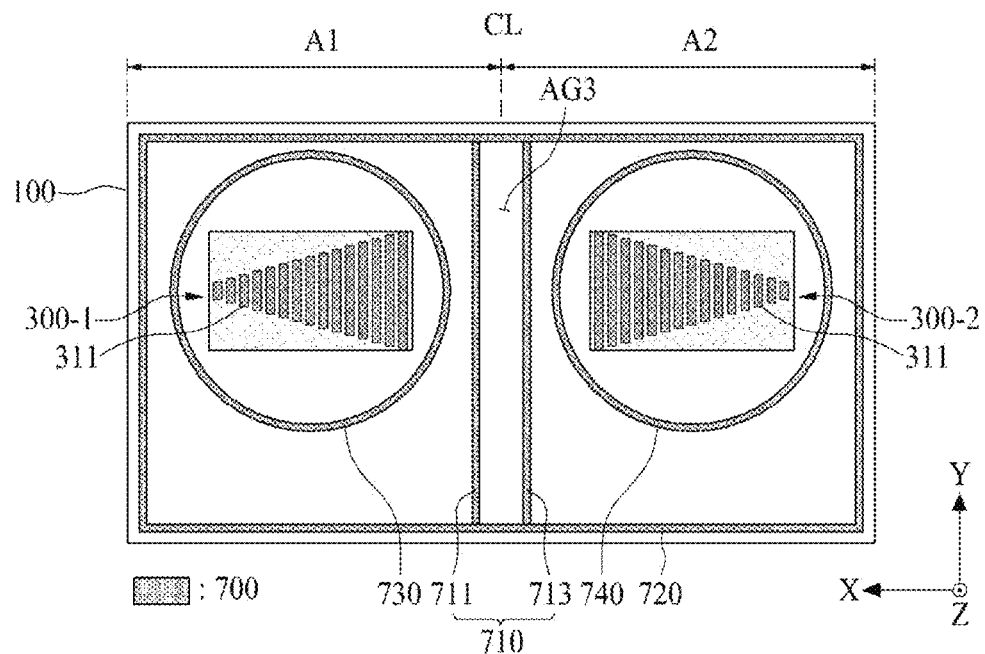
Figure 15C:
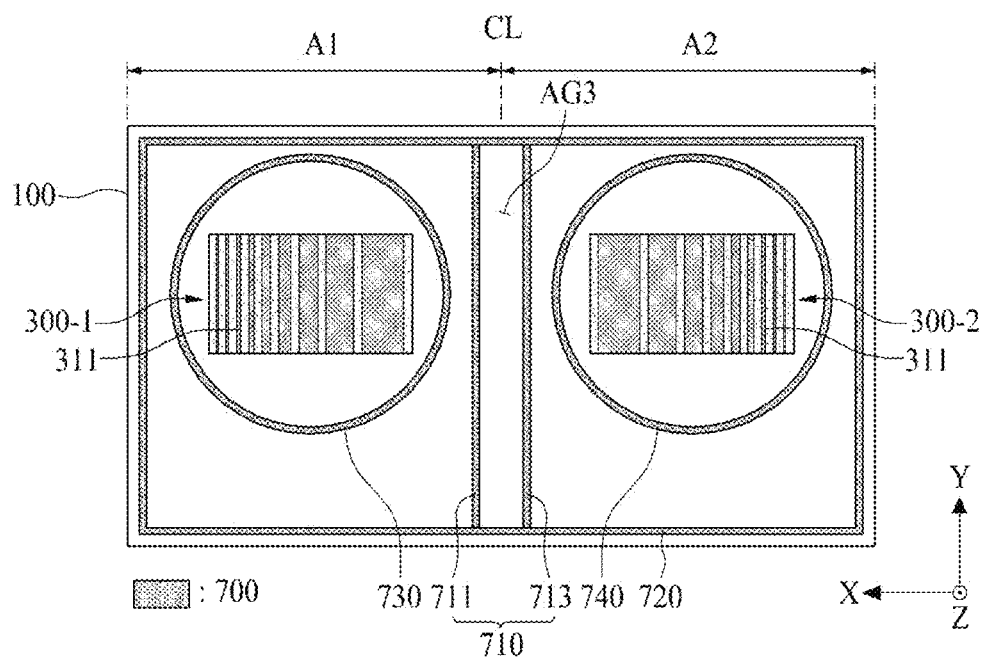

FIGS. 15A to 15C illustrate modified example embodiments of first and second flexible vibration modules in FIG. 14 and illustrate an example embodiment implemented by modifying an arrangement structure of a piezoelectric portion in the piezoelectric composite layer in FIG. 14. As illustrated in FIG. 15A, in each of first and second flexible vibration modules 300-1 and 300-2 according to a first modified example embodiment, except for that a length of each of a plurality of piezoelectric portions 311 increases progressively in a direction from an edge or a periphery to a center line CL of a display panel 100 on the basis of a length gradient, each of the first and second flexible vibration modules 300-1 and 300-2 is the same as the flexible vibration module illustrated in FIG. 3 or 13. Therefore, the plurality of piezoelectric portions 311 according to the first modification example embodiment may each have different vibration frequencies on the basis of different lengths. As a result, a sound pressure characteristic of each of a left sound and a right sound each generated based on a vibration of display panel 100 may increase and a sound reproduction band may expand. In FIG. 15A, the second partition member 720 may be omitted.

As illustrated in FIG. 15B, in each of first and second flexible vibration modules 300-1 and 300-2 according to a second modification example embodiment, except that a length of each of a plurality of piezoelectric portions 311 increases progressively in a direction from an edge or a periphery to a center line CL of a display panel 100 on the basis of a length gradient, each of the first and second flexible vibration modules 300-1 and 300-2 is the same as the flexible vibration module illustrated in FIG. 6. Therefore, the plurality of piezoelectric portions 311 according to the second modification example embodiment may each have different vibration frequencies on the basis of different lengths. As a result, a sound pressure characteristic of each of a left sound and a right sound each generated based on a vibration of display panel 100 may increase and a sound reproduction band may expand. In FIG. 15B, the second partition member 720 may be omitted.

As illustrated in FIG. 15C, in each of first and second flexible vibration modules 300-1 and 300-2 according to a third modification example embodiment, except for that a width of each of a plurality of piezoelectric portions 311 increases progressively in a direction from an edge or a periphery to a center line CL of a display panel 100 on the basis of a width gradient, each of the first and second flexible vibration modules 300-1 and 300-2 is the same as the flexible vibration module illustrated in FIG. 7. Therefore, the plurality of piezoelectric portions 311 according to the third modification example embodiment may each have different vibration frequencies on the basis of different widths. As a result, a sound pressure characteristic of each of a left sound and a right sound each generated based on a vibration of display panel 100 may increase and a sound reproduction band may expand. In FIG. 15C, the second partition member 720 may be omitted.

Figure 16A:
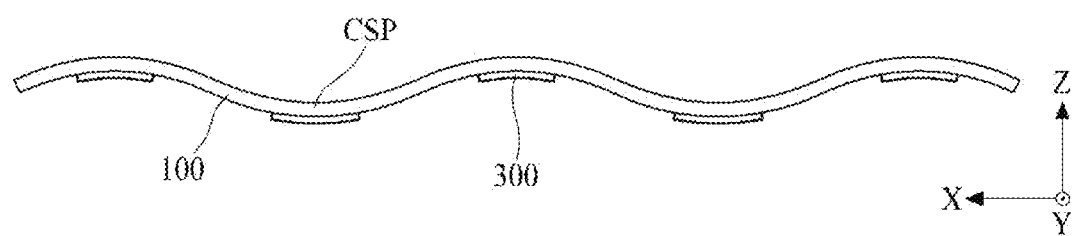
FIGS. 16A to 16C illustrate various display apparatuses to which a flexible vibration module according to example embodiments of the present disclosure may be applied.
Figure 16B:
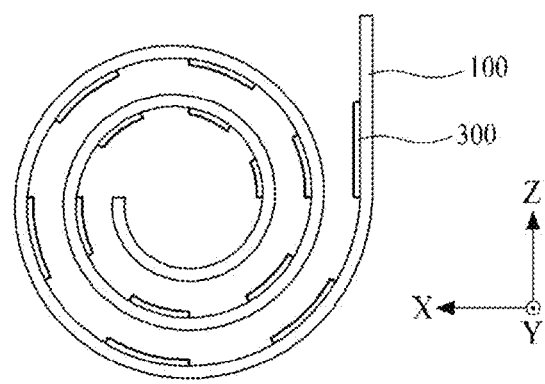
Figure 16C:
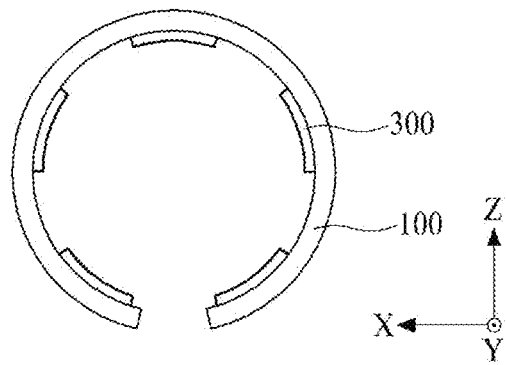

FIGS. 16A to 16C illustrate various display apparatuses to which a flexible vibration module according to example embodiments of the present disclosure may be applied and illustrate a display apparatus to which the flexible vibration module illustrated in each of FIGS. 3 to 11 is applied. A flexible vibration module according to example embodiments of the present disclosure may be a film type having flexibility, and may be applied to various application apparatuses.

As illustrated in FIG. 16A, a flexible vibration module 300 according to example embodiments of the present disclosure may be applied to a commercial display or a flexible display including a display panel 100 including a plurality of curved surface portions CSP that are concave or convex. For example, flexible vibration module 300 may be bent in a shape having a curvature value (or a curvature radius) matching or corresponding to a convex portion or a concave portion of each of the curved surface portions CSP of display panel 100 and may be in the convex portion or the concave portion of each of the curved surface portions CSP of display panel 100. In another example embodiment, flexible vibration module 300 may have a shape matching the curvature value (or the curvature radius) of each of the curved surface portions CSP of display panel 100 and may be on a whole rear surface of display panel 100.

As illustrated in FIG. 16B, flexible vibration module 300 according to example embodiments of the present disclosure may be applied to a rollable display including a display panel 100 that is wound in a spiral shape or unwound. For example, flexible vibration module 300 according to example embodiments of the present disclosure may have a shape having a curvature value (or a curvature radius) of display panel 100 that is wound in a spiral shape or unwound. A plurality of flexible vibration modules 300 may be arranged at certain intervals or distances on a rear surface of display panel 100. In another example embodiment, flexible vibration module 300 may have a shape matching or corresponding to the curvature value (or the curvature radius) of display panel 100 and may be on the whole rear surface of display panel 100.

As illustrated in FIG. 16C, flexible vibration module 300 according to example embodiments of the present disclosure may be applied to a wearable display including a display panel 100 that is wound around a wrist of a user and is bent in a "C"-shape. For example, flexible vibration module 300 according to example embodiments of the present disclosure may have a shape having a curvature value (or a curvature radius) of display panel 100 that is bent in the "C"-shape. A plurality of flexible vibration modules 300 may be arranged at certain intervals or distances on a rear surface of display panel 100. In another example embodiment, flexible vibration module 300 may have a shape matching the curvature value (or the curvature radius) of display panel 100 that is bent in the "C"-shape and may be disposed on the whole rear surface of display panel 100.

Figure 17:
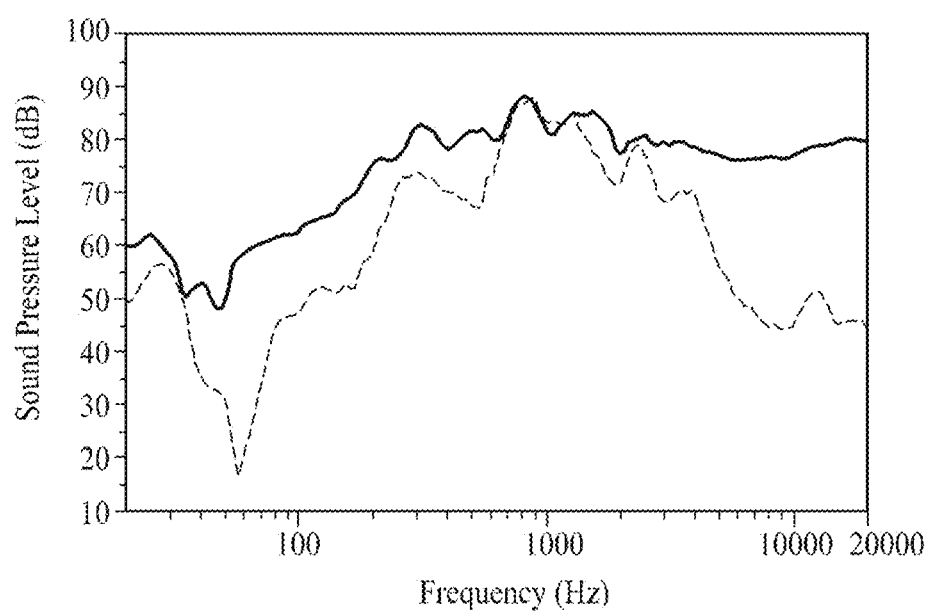
FIG. 17 is a graph showing a sound pressure characteristic of a display panel according to an example embodiment of the present disclosure and a sound pressure characteristic of a display panel according to a comparative example.

FIG. 17 is a graph showing a sound pressure characteristic of a display panel according to an example embodiment of the present disclosure and a sound pressure characteristic of a display panel according to a comparative example. In the sound pressure measurement of FIG. 17, Audio Precision Company's APx525 was used, a sine sweep was applied at 20 Hz to 20 kHz, and a sound pressure was measured at a position space apart from a display panel, a flexible vibration module, and a film speaker by 50 cm. The sine sweep may be a process of performing a sweep for a short time. In FIG. 17, the abscissa axis (x-axis) represents a frequency in hertz (Hz), and the ordinate axis (y-axis) represents a sound pressure level in decibels (dB).

In an example embodiment (a thick solid line) of the present disclosure, a display panel where a partition is not in the display apparatus illustrated in FIG. 15A has been prepared. In the comparative example (a dotted line), a display panel where a flexible vibration module including a plurality of piezoelectric portions having the same length and having no length gradient is attached on each of a left region and a right region has been prepared.

As illustrated in FIG. 17, comparing a display panel (a dotted line) according to the comparative example, a display panel (a thick solid line) according to an example embodiment of the present disclosure has a sound pressure level of 50 dB or more in a full audible frequency and has a sound pressure level of about 10 dB higher in a high-pitched sound band as well as a low-pitched sound band, and dipping of a sound pressure level is reduced in the full audible frequency to improve flatness of a sound pressure level. Here, flatness of a sound characteristic may be a level of a deviation between a highest sound pressure level and a lowest sound pressure level.

Therefore, in the flexible vibration module and the display apparatus including the same according to the present disclosure, a plurality of piezoelectric portions configuring a piezoelectric composite layer has various vibration frequencies on the basis of a size gradient. As a result, a sound pressure characteristic increases in a full audible frequency and a sound reproduction band expands. The flexible vibration module and the display apparatus including the same according to the present disclosure may be applied to various applications. For example, a display panel where the flexible vibration module according to the present disclosure is disposed and a display apparatus including the same may be applied to mobile apparatuses, video phones, smart watches, watch phones, wearable devices, foldable apparatuses, rollable apparatuses, bendable apparatuses, flexible apparatuses, curved apparatuses, electronic notebooks, electronic books, portable multimedia players (PMPs), personal digital assistants (PDAs), MP3 player, mobile medical apparatuses, electronic organizers, desktop personal computers (PCs), laptop PCs, netbook computers, workstations, navigation apparatuses, automotive navigation apparatuses, automotive displays, televisions (TVs), wall paper displays, signage apparatuses, game machines, notebook computers, monitors, cameras, camcorders, home appliances, etc.

The flexible vibration module according to an example embodiment of the present disclosure may be applied to organic light emitting lighting apparatuses or inorganic light emitting lighting apparatuses. Where the flexible vibration module according to the present disclosure is applied to a lighting apparatus, the flexible vibration module may act as lighting and a speaker. In some example embodiments, the flexible vibration module according to the present disclosure may be applied to a mobile apparatus, and the flexible vibration module may act as a speaker or a receiver.

A flexible vibration module and a display apparatus including the same according to the present disclosure will be described below. According to some example embodiments of the present disclosure, a flexible vibration module may include: a piezoelectric composite layer, including: a plurality of piezoelectric portions each having a piezoelectric characteristic, wherein at least two of the plurality of piezoelectric portions have different sizes; and a flexible portion between the plurality of piezoelectric portions. Each of the plurality of piezoelectric portions may have a different size and a different vibration frequency. At least two of the plurality of piezoelectric portions may have different lengths, different widths, and different thicknesses.

According to some example embodiments of the present disclosure, one of a length, a width, and a thickness of each of the plurality of piezoelectric portions may increase or decrease progressively in a direction from at least one end of the piezoelectric composite layer to a center portion of the piezoelectric composite layer. One of a length, a width, and a thickness of each of the plurality of piezoelectric portions may randomly vary between one end and another end of the piezoelectric composite layer. One of a length, a width, and a thickness of each of the plurality of piezoelectric portions may increase or decrease progressively in a direction from one end of the piezoelectric composite layer to another end opposite to the one end.

According to some example embodiments of the present disclosure, each of the plurality of piezoelectric portions may include: a lower piezoelectric portion; and an upper piezoelectric portion on the lower piezoelectric portion. Each of the plurality of piezoelectric portions may have a same thickness. At least two of the lower piezoelectric portions may have different thicknesses. The plurality of piezoelectric portions may have a same thickness; and a thickness of each of the lower piezoelectric portions may progressively or randomly change in a direction from one end of the piezoelectric composite layer to another end opposite to the one end. The flexible vibration module may further include an electrode between the lower piezoelectric portion and the upper piezoelectric portion. The flexible vibration module may further include: a first electrode between the lower piezoelectric portion and the upper piezoelectric portion; a second electrode between the lower piezoelectric portion and the upper piezoelectric portion; and an insulating layer between the first electrode and the second electrode.

According to some example embodiments of the present disclosure, a flexible vibration module, may include: a piezoelectric composite layer, including: a plurality of piezoelectric portions each having a piezoelectric characteristic; and a flexible portion between the plurality of piezoelectric portions, wherein the piezoelectric composite layer has a plurality of vibration frequencies. At least two of the plurality of piezoelectric portions may have different vibration frequencies. A vibration frequency of each of the plurality of piezoelectric portions may progressively or randomly change in a direction from one end of the piezoelectric composite layer to the other end opposite to the one end. Each of the plurality of piezoelectric portions may include: a lower piezoelectric portion; and an upper piezoelectric portion on the lower piezoelectric portion. The plurality of piezoelectric portions may have a same thickness; and a thickness of each of the lower piezoelectric portions progressively thickens or thins in a direction from at least one end of the piezoelectric composite layer to a center portion of the piezoelectric composite layer. Each of the plurality of piezoelectric portions may include an inorganic material; and the flexible portion may include at least one of an organic piezoelectric material and an organic non-piezoelectric material.

According to some example embodiments of the present disclosure, a display apparatus may include: a flexible vibration module, including: a piezoelectric composite layer, including: a plurality of piezoelectric portions each having a piezoelectric characteristic, wherein at least two of the plurality of piezoelectric portions have different sizes; and a flexible portion between the plurality of piezoelectric portions; and a display panel, wherein the display panel may include a display area configured to display an image and vibrate according to a vibration of the flexible vibration module. The display apparatus may further include a touch electrode configured to sense a touch, wherein the flexible vibration module may be configured to vibrate according to the touch. Each of the plurality of piezoelectric portions may include an inorganic material; and the flexible portion may include at least one of an organic piezoelectric material and an organic non-piezoelectric material.

According to some example embodiments of the present disclosure, the display panel may include a first region and a second region; the flexible vibration module may be a first flexible vibration module in the first region of the display panel; and a second flexible vibration module may be in the second region of the display panel. The display apparatus may further include: a rear structure on a rear surface of the display panel; and at least one partition member between the display panel and the rear structure and between the first flexible vibration module and the second flexible vibration module. The display apparatus may further include: a rear structure on a rear surface of the display panel; and a partition between the display panel and the rear structure, wherein the partition surrounds at least one of the first flexible vibration module and the second flexible vibration module. The display apparatus may further include another partition between the display panel and the rear structure, the another partition surrounding both the first and second flexible vibration modules, and the partition.

The above-described features, structure, and effect of the present disclosure are included in at least one example embodiment of the present disclosure, but are not limited to only one example embodiment. Furthermore, the features, structure, and effect described in at least one example embodiment of the present disclosure may be implemented through combination or modification of other example embodiments by those skilled in the art. Therefore, content associated with the combination and modification should be construed as being within the scope of the present disclosure. It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A vibration module, comprising:
   a piezoelectric composite layer, including:
      a plurality of piezoelectric portions each having a piezoelectric characteristic, and a flexible portion between the plurality of piezoelectric portions,
   wherein the plurality of piezoelectric portions is spaced apart from one another along a first direction,
   wherein at least two of the plurality of piezoelectric portions have different lengths along a second direction crossing to the first direction, and
   wherein the flexible portion comprises:
      a dummy pattern configured to surround at least one of one side and the other side of each of the plurality of piezoelectric portions; and
      a plurality of flexible patterns configured to extend between the plurality of piezoelectric portions from the dummy pattern.

2. The vibration module of claim 1, wherein each of the plurality of piezoelectric portions has a different size and a different vibration natural resonance frequency.

3. The vibration module of claim 1, wherein each of the plurality of piezoelectric portions have different lengths, different widths, and different thicknesses.

4. The vibration module of claim 1, wherein one of a length, a width, and a thickness of each of the plurality of piezoelectric portions increases or decreases progressively in a direction from at least one end of the piezoelectric composite layer to a center portion of the piezoelectric composite layer.

5. The vibration module of claim 1, wherein one or more of a length, a width, and a thickness of each of the plurality of piezoelectric portions randomly varies between one end and another end of the piezoelectric composite layer.

6. The vibration module of claim 1, wherein one or more of a length, a width, and a thickness of each of the plurality of piezoelectric portions increases or decreases progressively in a direction from one end of the piezoelectric composite layer to another end opposite to the one end.

7. The vibration module of claim 1, further comprising:
   a first electrode on a first surface of the plurality of piezoelectric portions and a first surface of the flexible portion; and
   a second electrode on a second surface of the plurality of piezoelectric portions and a second surface of the flexible portion, wherein each of the first surface and the second surface is configured to have a plane surface structure.

8. The vibration module of claim 7, wherein each of the plurality of piezoelectric portions has a same thickness.

9. The vibration module of claim 1, wherein a size of the dummy pattern progressively changes in a direction from one end of the piezoelectric composite layer to a center portion of the piezoelectric composite layer.

10. A vibration module, comprising:
a piezoelectric composite layer, including:
   a plurality of piezoelectric portions each having a piezoelectric characteristic, the plurality of piezoelectric portions being spaced apart from one another along a first direction; and
   a flexible portion between the plurality of piezoelectric portions;
a first electrode on a first surface the plurality of piezoelectric portions and a first surface of the flexible portion; and
a second electrode on a second surface of the plurality of piezoelectric portions and a second surface of the flexible portion,
wherein each of the first surface and the second surface is configured to have a plane surface structure,
wherein the piezoelectric composite layer has a plurality of natural resonance frequencies,
wherein at least two of the plurality of piezoelectric portions have different lengths along a second direction crossing to the first direction, and
wherein the flexible portion comprises:
a dummy pattern configured to surround at least one of one side and the other side of each of the plurality of piezoelectric portions; and
a plurality of flexible patterns configured to extend between the plurality of piezoelectric portions from the dummy pattern.

11. The vibration module of claim 10, wherein at least two of the plurality of piezoelectric portions have different natural resonance frequencies.

12. The vibration module of claim 10, wherein a natural resonance frequency of each of the plurality of piezoelectric portions progressively or randomly changes in a direction from one end of the piezoelectric composite layer to the other end opposite to the one end.

13. The vibration module of claim 10, wherein:
the plurality of piezoelectric portions have a same thickness; or
wherein one or more of a length, a width, and a thickness of each of the plurality of piezoelectric portions increases or decreases progressively in a direction from at least one end of the piezoelectric composite layer to a center portion of the piezoelectric composite layer.

14. The vibration module of claim 10, wherein:
each of the plurality of piezoelectric portions comprises an inorganic material; and
the flexible portion comprises at least one of an organic piezoelectric material and an organic non-piezoelectric material.

15. An apparatus, comprising:
a vibration module, including:
a piezoelectric composite layer, including:
   a plurality of piezoelectric portions each having a piezoelectric characteristic, the plurality of piezoelectric portions being spaced apart from one another along a first direction; and
   a flexible portion between the plurality of piezoelectric portions;
   a first electrode on a first surface of the piezoelectric portions and a first surface of the flexible portion; and
   a second electrode on a second surface of the piezoelectric portions and a second surface of the flexible portion; and
a vibration plate configured to vibrate according to a vibration of the vibration module,
wherein each of the first surface and the second surface is configured to have a plane surface structure,
wherein at least two of the plurality of piezoelectric portions have different lengths along a second direction crossing to the first direction, and
wherein the flexible portion comprises:
a dummy pattern configured to surround at least one of one side and the other side of each of the plurality of piezoelectric portions; and
a plurality of flexible patterns configured to extend between the plurality of piezoelectric portions from the dummy pattern.

16. The apparatus of claim 15, further comprising a touch electrode configured to sense a touch,
wherein the vibration module is configured to vibrate according to the touch.

17. The apparatus of claim 15, wherein:
each of the plurality of piezoelectric portions comprises an inorganic material; and
the flexible portion comprises at least one of an organic piezoelectric material and an organic non-piezoelectric material.

18. The apparatus of claim 15, wherein:
the vibration plate comprises a first region and a second region;
the vibration module comprises:
a first vibration module disposed in the first region of the vibration plate; and
a second vibration module disposed in the second region of the vibration plate.

19. The apparatus of claim 18, further comprising
at least one partition member between first vibration module and the second vibration module.

20. The apparatus of claim 19, wherein the at least one partition member surrounds at least one of the first vibration module and the vibration module.

21. The apparatus of claim 19, further comprising another partition member surrounding both the first and second flexible vibration modules, and the at least one partition member.

* * * * *

UNITED STATES PATENT AND TRADEMARK OFFICE
CERTIFICATE OF CORRECTION

| | | |
|---|---|---|
| PATENT NO. | : 11,533,566 B2 | Page 1 of 1 |
| APPLICATION NO. | : 17/180560 | |
| DATED | : December 20, 2022 | |
| INVENTOR(S) | : YongWoo Lee et al. | |

It is certified that error appears in the above-identified patent and that said Letters Patent is hereby corrected as shown below:

On the Title Page

Column 1, Item (62) should read:
--(62) Continuation of application No. 16 / 443,090, filed on Jun. 17, 2019, now Pat . No. 10,959,025--.

Signed and Sealed this
Fourteenth Day of March, 2023

Katherine Kelly Vidal
*Director of the United States Patent and Trademark Office*